(12) United States Patent
Whetsel

(10) Patent No.: US 9,599,669 B2
(45) Date of Patent: Mar. 21, 2017

(54) DECOMPRESSED/COMPRESSED DATA PARALLEL SCAN PATHS WITH INPUT/OUTPUT SHIFT REGISTER, SCI/SCO

(71) Applicant: TEXAS INSTRUMENTS INCORPORATED, Dallas, TX (US)

(72) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/151,035

(22) Filed: May 10, 2016

(65) Prior Publication Data

US 2016/0252574 A1    Sep. 1, 2016

Related U.S. Application Data

(62) Division of application No. 14/625,351, filed on Feb. 18, 2015, now Pat. No. 9,360,521, which is a division
(Continued)

(51) Int. Cl.
*G01R 31/3183* (2006.01)
*G01R 31/3185* (2006.01)
(Continued)

(52) U.S. Cl.
CPC . *G01R 31/318335* (2013.01); *G01R 31/3172* (2013.01); *G01R 31/3177* (2013.01);
(Continued)

(58) Field of Classification Search
CPC ...... G01R 31/318547; G01R 31/31921; G01R 31/318597; G01R 31/318558; G01R 31/3177; G01R 31/318335; G01R 31/31723; G01R 31/31727; G01R 31/3172; G06F 11/267; G06F 11/2733; H03M 7/30; H03M 7/3066
(Continued)

(56) References Cited

U.S. PATENT DOCUMENTS 7,143,324 B2    11/2006 Bratt et al.
7,278,123 B2    10/2007 Ravi et al.
(Continued)

OTHER PUBLICATIONS

A. Leininger, M. Fischer, M. Braun, M. Richter and M. Goessel, "Using timing flexibility of automatic test equipment to complement X-tolerant test compression techniques," 2007 IEEE International Test Conference, Santa Clara, CA, 2007, pp. 1-9.*
(Continued)

*Primary Examiner* — Cynthia Britt
(74) *Attorney, Agent, or Firm* — Lawrence J. Bassuk; Charles A. Brill; Frank D. Cimino

(57) ABSTRACT

The disclosure describes novel methods and apparatuses for accessing test compression architectures (TCA) in a device using either a parallel or serial access technique. The serial access technique may be controlled by a device tester or by a JTAG controller. Further the disclosure provides an approach to access the TCA of a device when the device exists in a daisy-chain arrangement with other devices, such as in a customer's system. Additional embodiments are also provided and described in the disclosure.

2 Claims, 21 Drawing Sheets

Related U.S. Application Data of application No. 14/023,068, filed on Sep. 10, 2013, now Pat. No. 8,990,650, which is a division of application No. 13/343,998, filed on Jan. 5, 2012, now Pat. No. 8,560,905, which is a division of application No. 12/795,326, filed on Jun. 7, 2010, now Pat. No. 8,112,685.

(60) Provisional application No. 61/186,117, filed on Jun. 11, 2009.

(51) Int. Cl.
  *G06F 11/273* (2006.01)
  *G01R 31/3177* (2006.01)
  *G01R 31/317* (2006.01)

(52) U.S. Cl.
  CPC . *G01R 31/31723* (2013.01); *G01R 31/31727* (2013.01); *G01R 31/318547* (2013.01); *G06F 11/2733* (2013.01)

(58) Field of Classification Search
  USPC .................................................. 714/726–731
  See application file for complete search history.

(56) References Cited

U.S. PATENT DOCUMENTS

| | | | | |
|---|---|---|---|---|
| 7,461,309 B2* | 12/2008 | Kiryu | ............ | G01R 31/318544 714/724 |
| 7,797,603 B2 | 9/2010 | Rajski et al. | | |
| 7,818,644 B2 | 10/2010 | Rajski et al. | | |
| 7,890,899 B2 | 2/2011 | Cooke et al. | | |
| 7,913,137 B2 | 3/2011 | Mukherjee et al. | | |
| 8,065,651 B2 | 11/2011 | Kapur et al. | | |
| 8,112,685 B2 | 2/2012 | Whetsel | | |
| 8,560,905 B2 | 10/2013 | Whetsel | | |
| 8,726,112 B2* | 5/2014 | Rajski | ............ | G01R 31/318547 714/731 |
| 8,990,650 B2 | 3/2015 | Whetsel | | |
| 9,360,521 B2* | 6/2016 | Whetsel | ......... | G01R 31/318547 |
| 2007/0288796 A1 | 12/2007 | Whetsel | | |
| 2008/0091989 A1* | 4/2008 | Bakhshi | ................. | G11C 29/26 714/718 |
| 2008/0281547 A1* | 11/2008 | Nakamura | ....... | G01R 31/31855 702/120 |

OTHER PUBLICATIONS

F. Karimi, Z. Navabi, W. M. Meleis and F. Lombardi, "Using data compression in automatic test equipment for system-on-chip testing," in IEEE Transactions on Instrumentation and Measurement, vol. 53, No. 2, pp. 308-317, Apr. 2004.*

Hatami, S.; Alisafaee, M.; Atoofian, E.; Navabi, Z.; Afzali-Kusha, A.;, "A low-power scan-path architecture," Circuits and Systems, 2005. ISCAS 2005. IEEE International Symposium on, vol., No., pp. 5278-5281 vol. 5, May 23-26, 2005 doi: 10.1109/ISCAS.2005. 1465826 URL:http://ieeexplore.ieee.org/stamp/stamp.jsp?tp= &arnumber=1465826&isnumber=31469.

Furukawa, H.; Wen, X.; Miyase, K.; Yamato, Y.; Kajihara, S.; Girard, P.; Wang, L.-T.; Tehranipoor, M.;, "CTX: A Clock-Gating Based Test Relaxation and X-Filling Scheme for Reducing Yield Loss Risk in At-Speed Scan Testing," Asian Test Symposium, 2008. ATS '08. 17th, vol., No., pp. 397-402, Nov. 24-27, 2008doi: 10.1109/ATS.2008.27.

Chandra, A.; Chakrabarty, K.;, "A unified approach to reduce SOC test data volume, scan power and testing time," Computer Aided Design of Integrated Circuits and Systems, IEEE Transactions on, vol. 22, No. 3, pp. 352-363, Mar. 2003 doi: 10.1109/TCAD.2002. 807895 URL: http://ieeexplore.ieee.org/stamp/stamp.jsp?tp= &arnumber=I182080&isnumber=26533.

* cited by examiner

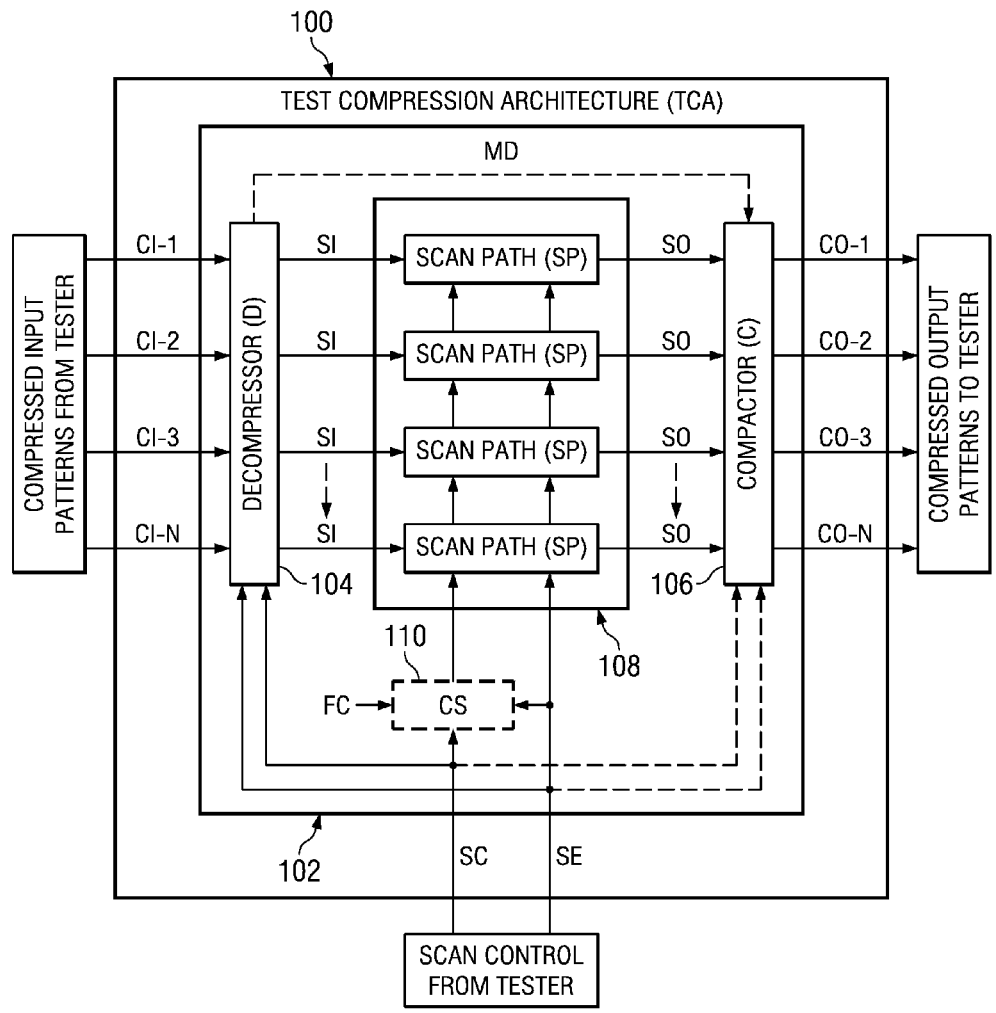
FIG. 1
*(PRIOR ART)*
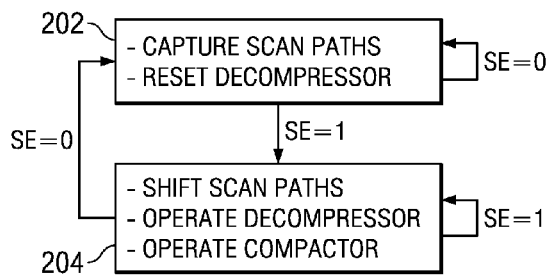
FIG. 2 *(PRIOR ART)*
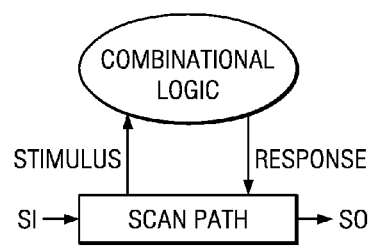
FIG. 3 *(PRIOR ART)*

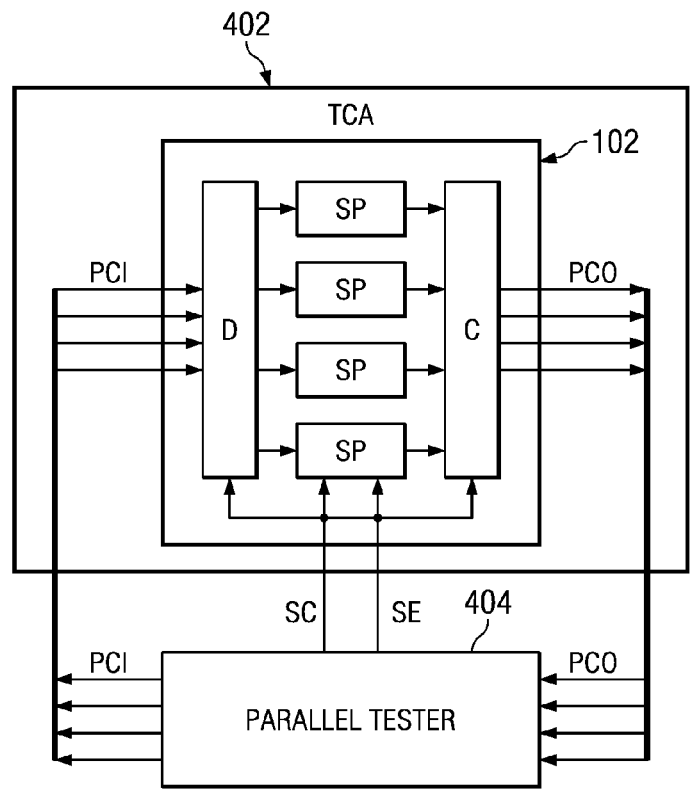
FIG. 4
*(PRIOR ART)*
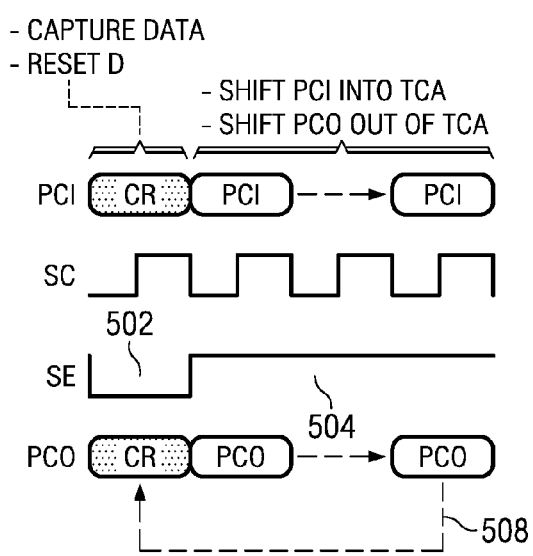
FIG. 5 *(PRIOR ART)*

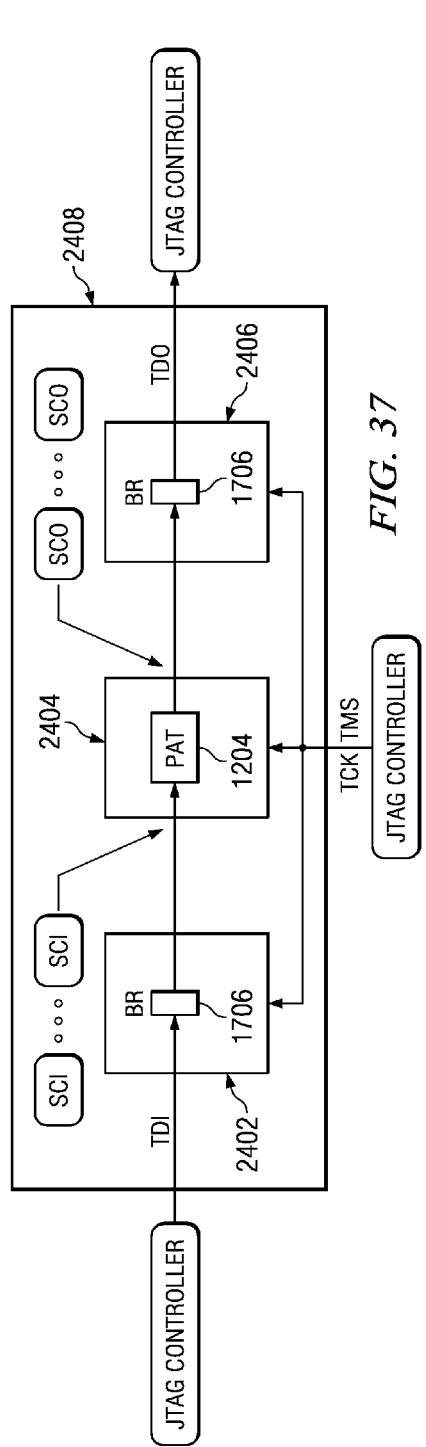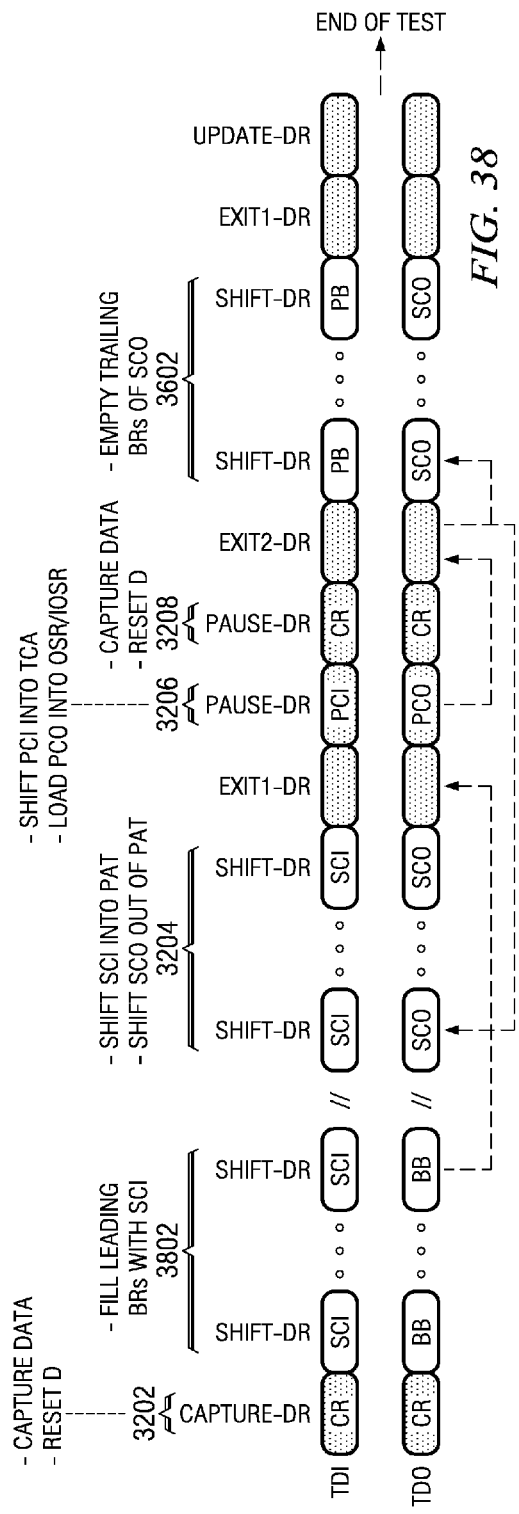

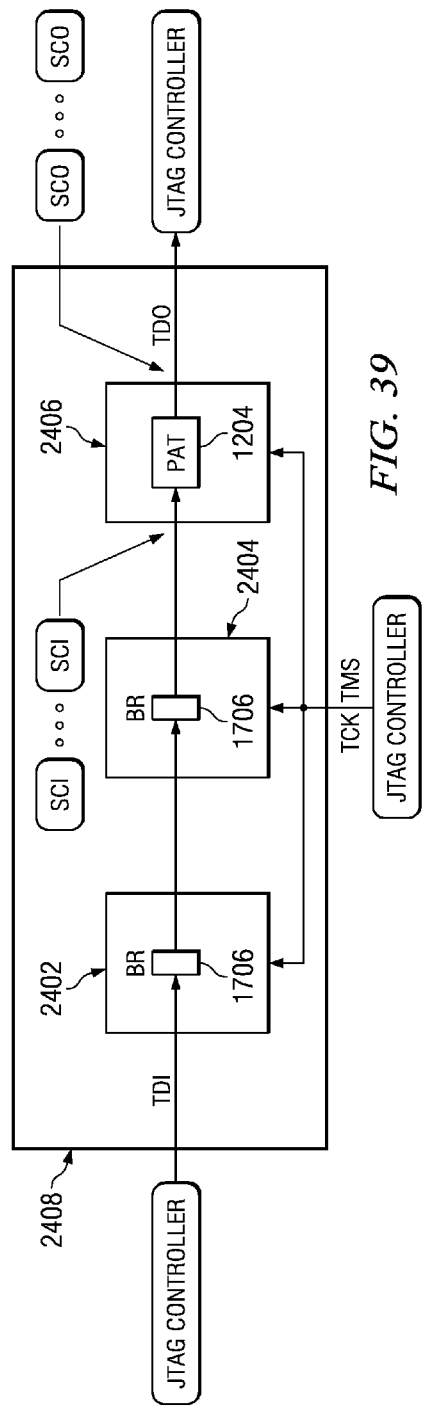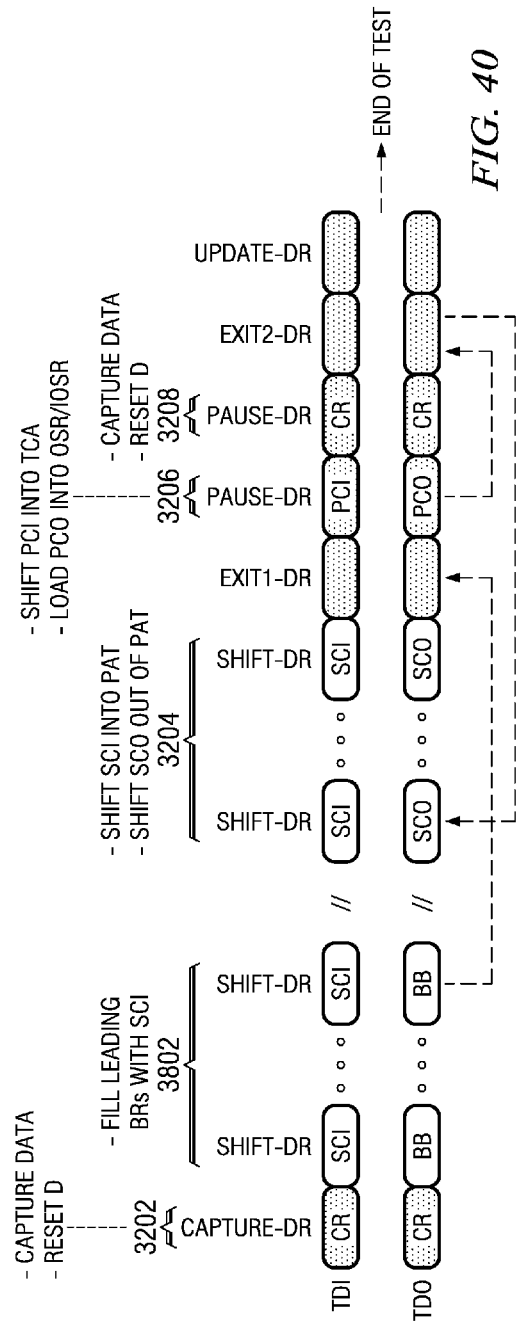

DECOMPRESSED/COMPRESSED DATA PARALLEL SCAN PATHS WITH INPUT/OUTPUT SHIFT REGISTER, SCI/SCO

This Application is a divisional of prior application Ser. No. 14/625,351, filed Feb. 18, 2015, now U.S. Pat. No. 9,360,521, issued Jun. 7, 2016;

Which was a divisional of prior application Ser. No. 14/023,068, filed Sep. 10, 2013, now U.S. Pat. No. 8,990,650, granted Mar. 24, 2015;

Which was a divisional of prior application Ser. No. 13/343,998, filed Jan. 5, 2012, now U.S. Pat. No. 8,560,905, granted Oct. 15, 2013;

Which was a divisional of prior application Ser. No. 12/795,326, filed Jun. 7, 2010, now U.S. Pat. No. 8,112,685, granted Feb. 7, 2012;

Which claims priority from Provisional Application No. 61/186,117, filed Jun. 11, 2009.

FIELD OF THE DISCLOSURE

This disclosure relates generally to test compression architectures in electrical devices and in particular to accessing test compression architectures using either a parallel or serial interface.

BACKGROUND OF THE DISCLOSURE

A growing number of electrical devices, which may be ICs or embedded cores within ICs, are being tested using test compression architectures (TCA), such as Mentor's TestKompress™ embedded deterministic test technology, incorporated herein by reference. Fundamentally a TCA consists of three elements, a decompressor circuit, a parallel scan path arrangement, and a compactor circuit. The decompressor circuit receives compressed input data from one or more inputs from a tester, decompresses the compressed input data into parallel stimulus patterns that are input to parallel scan paths. The compactor circuit receives parallel response patterns that are output from the parallel scan paths, compacts the response patterns down to one or more compressed data outputs that are input to the tester. A first advantage of TCAs is that they allow a large number of shorter length parallel scan paths to be accessed using only a small number of compressed data inputs and compressed data outputs. A second advantage of TCAs is that they reduce the amount of test data that needs to be transmitted between the tester and device under test, since the test data is compressed. The present disclosure provides methods and apparatuses for enabling a device TCA to be accessed for testing using either a parallel bus of compressed input and compressed output test signals or a serial bus of a compressed input and compressed output test signals.

FIG. 1 illustrates an example of device 100 containing a test compression architecture (TCA) 102. The TCA 102 is interfaced to an external tester via a parallel bus of N compressed data input (CI) signals, a parallel bus of N compressed data output (CO) signals, a scan clock (SC) input, and a scan enable (SE) input. While TCAs may use only a single CI input and a single CO output, it is more common in a device manufacturing test environment to use a bus of parallel CI inputs and a bus of parallel CO outputs, since this reduces device test time. The TCA 102 comprises a decompressor 104, a compactor 106, and parallel scan paths 108. The TCA 102 may also include a clock selector (CS) 110 to allow the parallel scan paths to be clocked by the devices functional clock (FC) at times when the parallel scan paths are capturing response data. The decompressor has inputs coupled to the CI, SC and SE inputs and outputs coupled to the scan inputs (SI) of the parallel scan paths 108. The compactor has inputs coupled to the scan outputs (SO) of parallel scan paths 108 and an output coupled to the CO output. The parallel scan paths 108, in addition to the SI inputs and SO outputs, have inputs coupled to the SC and SE inputs, inputs coupled to response outputs from combinational logic, and outputs coupled to stimulus inputs to combinational logic, as shown in FIG. 3. If the CS 110 is used, the SE input will control it to pass the SC signal to the parallel scan paths 108 during shift operations and to pass the FC signal to the parallel scan paths 108 during capture operations.

FIG. 2 illustrates the operational states 202 and 204 of the TCA during test. In state 202 when the SE input is low and an SC input occurs the parallel scan paths capture response data from the combinational logic and the decompressor is reset to a known state. If CS 110 is used, the logic low on SE will select the FC signal to clock the parallel scan paths in state 202. In state 204 when the SE input is high and SC inputs occur the decompressor 104 decompresses the data input on CI inputs into parallel scan inputs (SI) that are shifted into the parallel scan paths, and the compactor 106 inputs and compacts the parallel scan outputs (SO) from the parallel scan paths into compressed outputs that are output on the CO outputs. If CS 110 is used, the logic high on SE will select the SC signal to clock the parallel scan paths in state 204. The TCA will remain in state 204 until the compressed input to the parallel scan paths and the compressed output from the scan paths is complete. As can be seen the capture and shift operation states of the TCA is similar to the capture and shift operation states of conventional scan paths, with the exception that the TCA includes the additional operations of decompressing the data input on the CI inputs to produce the scan inputs (SI) to the parallel scan paths and compressing the scan outputs (SO) from the parallel scan paths into a compressed form that can be output on the CO outputs.

While the example of FIG. 2 shows SE being low in state 202 and high in state 204, the logic levels of SE for these states could be reversed if desire.

Most known decompressors 104 utilize a linear feedback state machine (LFSM) in conjunction with a phase shifter circuit to produce the output patterns that are applied to the SI inputs of the parallel scan paths 108. In the referenced Mentor TestKompress™ technology, the LFSM is referred to as a ring generator which is a particular type of linear feedback shift register. The ring generator receives the CI input data and, in response, produces pseudo random input patterns to the phase shifter. The phase shifter responds to the pseudo random input patterns to output stimulus input (SI) patterns to the parallel scan paths. The CI input data modifies the output patterns from the ring generator to allow the phase shifter to produce the desired stimulus pattern input to the parallel scan paths.

Most known compactors 106 utilize XOR gating trees that input the scan outputs (SO) from the parallel scan paths and compress them, via XOR gating, into compacted signals that can be output on the CO outputs. While simple compactors may only use XOR gating trees, more sophisticated compactors, such as the compactor used the reference Mentor TestKompress™ technology, may use XOR gating trees in combination with masking circuitry to allow masking off unknown scan outputs (SO) from the parallel scan path scan to prevent the unknown scan outputs from corrupting the compacted signals output on the CO outputs. If the compactor contains masking circuitry it can receive masking data (MD) from the decompressor 104 and control from SC and SE to load the masking data, as shown in dotted line in FIG. 1.

FIG. 4 illustrates an example of a device 402 with a TCA 102 being connected to an external parallel tester 404 via parallel CI (PCI), parallel CO (PCO), SC, and SE interface signals to allow TCA test patterns to be applied to the device. This example is typical of how the device manufacturer would test the device.

FIG. 5 illustrates the tester 404 of FIG. 4 operating the SC and SE signals to perform a TCA scan cycle. The scan cycle includes a capture operation 502 that Captures response data and Resets the decompressor to a starting seed state, i.e. state 202 of FIG. 2, followed by a shift operation 504, whereby the tester inputs PCI data to the TCA decompressor 104 and receives PCO data from the TCA compactor 106, i.e. state 204 of FIG. 2. The response capture and decompressor reset operation is indicated in this and following timing diagrams as CR. The shift operation 504 continues until the parallel scan paths are filled with stimulus data and emptied of response data. The scan cycle of FIG. 5 repeats 508 until all the TCA test patterns have been applied and the TCA test is complete.

FIGS. 4 and 5 have illustrated an example of how a tester 404 can access a device's TCA 102 for testing when a connection can be made between the tester and the device's TCA interface. As seen in FIG. 4 the connection between the tester and device TCA requires a direct connection for the PCI signals, a direct connection for the SC signal, a direct connection for the SE signal and a direct connection for the PCO signal.

The present disclosure, as will described in detail below, identifies how to modify a TCA to allow the TCA to be selectively accessed using parallel CI and parallel CO signals coupled to high cost parallel testers as shown in regard to FIG. 4 or using serial CI (SCI) and serial CO (SCO) signals coupled to low cost serial testers. Additionally, the disclosure identifies how to test a device TCA using low cost JTAG controllers.

BRIEF SUMMARY OF THE DISCLOSURE

This disclosure provides methods and apparatuses for selectively enabling device TCA testing to occur using high cost parallel testers or low cost serial testers or JTAG controllers.

BRIEF DESCRIPTION OF THE VIEWS OF THE DRAWINGS

FIG. 1 illustrates a conventional test compression architecture (TCA) within a device.

FIG. 2 illustrates the basic operations of a TCA.

FIG. 3 illustrates the stimulus and response connections between combinational logic and TCA scan paths in a device.

FIG. 4 illustrates a connection between a tester and a device TCA.

FIG. 5 illustrates timing of a tester applying TCA scan cycles.

FIG. 37 illustrates a JTAG controller accessing the PAT of an intermediate device in a daisy-chain arrangement of devices using the alternate SE circuitry of FIG. 34 according to the disclosure.

FIG. 38 illustrates the TAP controller state transitions during JTAG controller access of the PAT of FIG. 37 according to the disclosure.

FIG. 39 illustrates a JTAG controller accessing the PAT of a last device in a daisy-chain arrangement of devices using the alternate SE circuitry of FIG. 34 according to the disclosure.

FIG. 40 illustrates the TAP controller state transitions during JTAG controller access of the PAT of FIG. 39 according to the disclosure.

DETAILED DESCRIPTION OF THE DISCLOSURE

Figure 6:
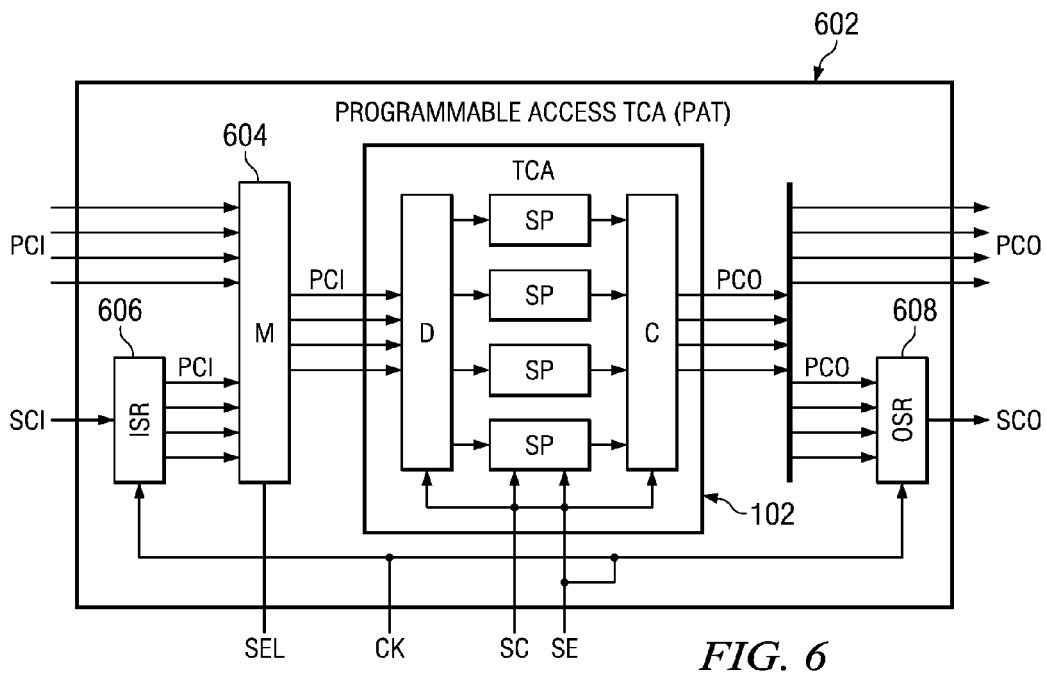
FIG. 6 illustrates a first embodiment of a programmable access TCA (PAT) according to the disclosure.

FIG. 6 illustrates how a TCA 102 is modified into a programmable access TCA (PAT) 602 according to the disclosure. As seen the PAT 602 comprises a TCA 102, a multiplexer (M) 604, an input shift register (ISR) 606, and an output shift register (OSR) 608. TCA 102 inputs a bus of PCI signals from M 604 and the SE and SC signal from terminals on the PAT. TCA 102 outputs a bus of PCO signals to OSR 608 and to terminals on the PAT. M 604 inputs a bus of PCI signals from terminals on the PAT, a bus of PCI signals from ISR 606, and a select (SEL) signal from a terminal on the PAT. The ISR 606 inputs a serial compressed input (SCI) signal from a terminal on the PAT and a clock (CK) signal from a terminal on the PAT. The ISR 606 outputs a bus of PCI signals to M 604. The OSR 608 inputs the bus of PCO signals from the TCA, the CK signal, and the SE signal. The OSR 608 outputs a serial compressed output (SCO) signal to a terminal of the PAT 602. ISR 606 is a serial to parallel register that responds to the CK signal to input serial data from SCI and output the data in parallel on the PCI output bus. OSR 608 is a parallel to serial register that responds to the CK signal to; (1) load parallel data from the TCA's PCO bus when SE is in a first state (high in this disclosure) and (2) to shift the loaded data out on the SCO signal when SE is in a second state (low in this disclosure).

Figure 7:
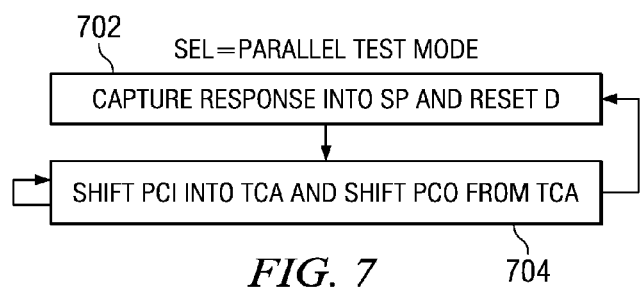
FIG. 7 illustrates a parallel access test mode to the first PAT embodiment according to the disclosure.

FIG. 7 illustrates the operational states 702 and 704 of the PAT 602 when the SEL signal is set to place the PAT in the parallel test mode. As seen, operational state 702 is the same as operational state 202 of FIG. 2 in that when SE is low and an SC clock occurs response is captured into the TCA scan paths 108 and the TCA decompressor (D) 104 is reset. Also as seen, operational state 704 is the same as operational state 204 of FIG. 2 in that when SE is high and SC clocks occur PCI data from the PAT terminals is shifted into the TCA's decompressor 104, the scan paths are shifted to input SI data from the decompressor and to output SO data to the compactor 106 to be output on the PAT's PCO terminals. The parallel test mode requires use of the PCI, PCO, SC, SE, and SEL PAT signal terminals.

Figure 8:
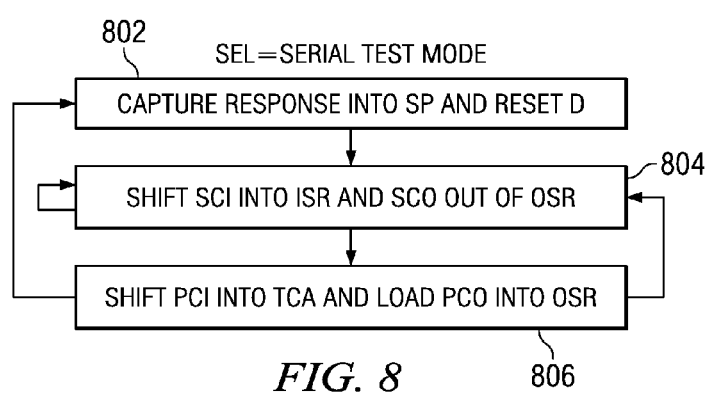
FIG. 8 illustrates a serial access test mode to the first PAT embodiment according to the disclosure.

FIG. 8 illustrates the operational states 802, 804, and 806 of the PAT 602 when the SEL signal is set to place the PAT in the serial test mode. State 802 is the same as state 702 of FIG. 7 in that in response to the SC and SE signals the scan paths capture response data and the decompressor (D) is reset. In state 804 the SE signal is low and the CK input is active to shift SCI data into ISR 604 from the SCI input terminal and to shift SCO data from OSR 608 to the SCO output terminal. In state 806 the SE signal is high and a CK occurs to shift PCI data from ISR 606 into the TCA scan paths 108, via M 604, and to load PCO data from the TCA compactor 106 into OSR 608. The serial test mode requires use of the SCI, SCO, CK, SC, SE, and SEL PAT signal terminals.

Figure 9:
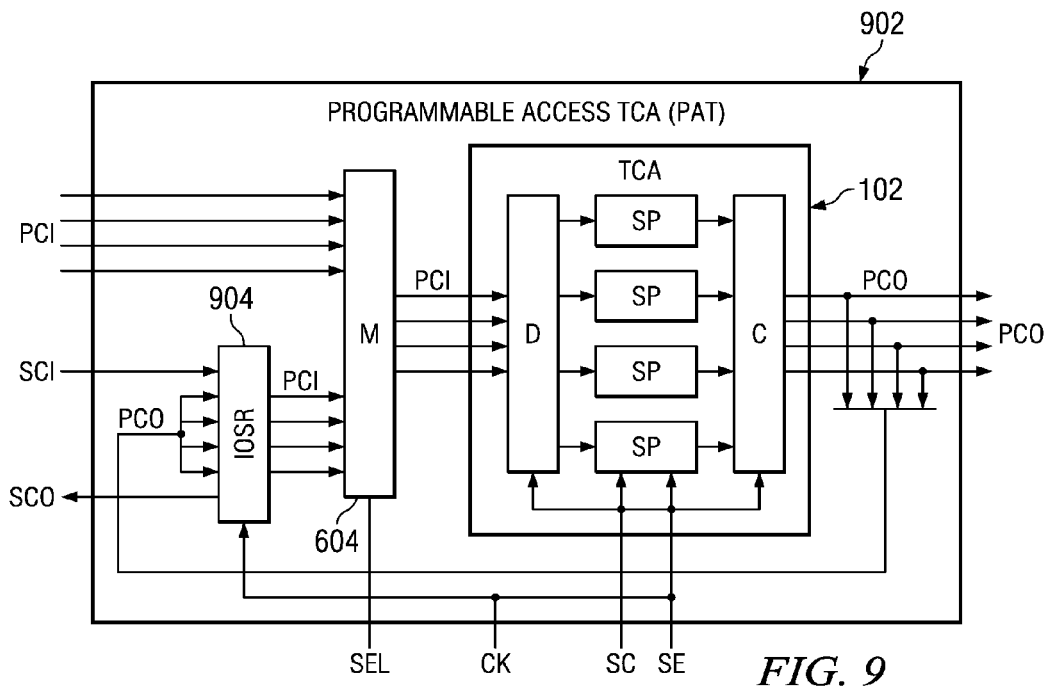
FIG. 9 illustrates a second embodiment of a programmable access TCA (PAT) according to the disclosure.

FIG. 9 illustrates an alternate way of modifying a TCA 102 modified into a programmable access TCA (PAT) 902 according to the disclosure. As seen the PAT 902 comprises a TCA 102, a multiplexer (M) 604, and an input/output shift register (IOSR) 904. TCA 102 inputs a bus of PCI signals from M 604 and the SE and SC signal from terminals on the PAT. TCA 102 outputs a bus of PCO signals to IOSR 904 and to terminals on the PAT. M 604 inputs a bus of PCI signals from terminals on the PAT, a bus of PCI signals from IOSR 904, and the SEL signal from a terminal on the PAT. The IOSR 904 inputs the SCI signal from a terminal on the PAT, the PCO output bus from the TCA 102, the CK signal from a terminal on the PAT, and the SE signal from a terminal on the PAT. The IOSR 904 outputs a bus of PCI signals to M 604 and the SCO signal to a terminal on the PAT. IOSR 904 is a serial to parallel and parallel to serial register that responds to the CK and SE signals to; (1) input serial data from SCI and output the data in parallel on the PCI output bus to TCA 102 via M 604 and (2) input the parallel PCO data from the TCA and serially output the PCO data on SCO. IOSR 904 inputs parallel data from PCO when SE is in a first state (high in this disclosure) and a clock is applied to the CK signal. IOSR 904 serially inputs data from SCI and serially outputs data on SCO when SE is in a second state (low in this disclosure) and clocks are applied to the CK signal.

When PAT 902 is placed in the parallel test mode by the SEL signal, its operational states are exactly the same as described and shown in regard to PAT 602 of FIGS. 6 and 7.

Figure 10:
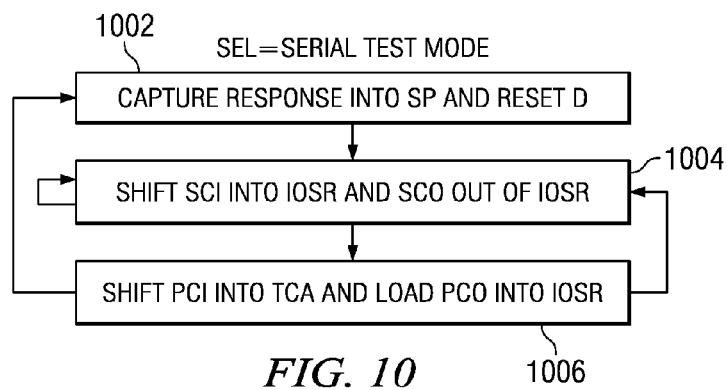
FIG. 10 illustrates a serial access test mode to the second PAT embodiment according to the disclosure.

FIG. 10 illustrates the operational states 1002, 1004 and 1006 of PAT 902 when the SEL signal is set to place the PAT 902 in the serial test mode. As seen, the operational state 1002 of PAT 902 is the same as the operational state 802 of PAT 602 of FIG. 7. Operational state 1004 of PAT 902 only differs from operation state 804 of PAT 602 of FIG. 7 in that during operational state 1004 SCI is shifted into IOSR and SCO is shifted out of IOSR, instead of into and out of the separate ISR 606 and OSR 608 respectively. Operational state 1006 of PAT 902 only differs from operation state 806 of PAT 602 of FIG. 7 in that during operational state 1006 PCO data is loaded into IOSR 904 instead of OSR 608.

Figure 11:
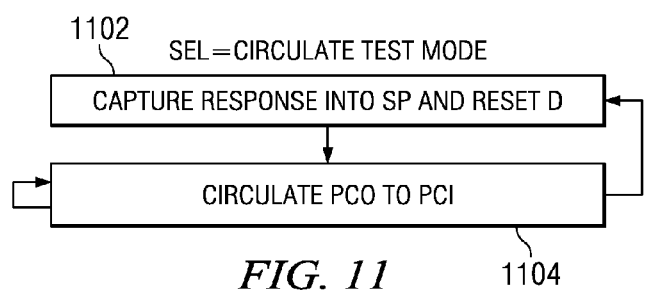
FIG. 11 illustrates a circulate test mode of the second PAT embodiment according to the disclosure.

FIG. 11 illustrates additional operational states 1102 and 1104 that are possible with PAT 902. State 1102 is the same as states 1002 and 802. State 1104 allows the PCO output from TCA 102 to be circulated through IOSR 904 and M 604 to be input to the PCI input of TCA 102. To operate in this PCO to PCI circulate test mode the SE input is high and clocks are applied to the CK input. This circulation mode of operation is useful for self testing the operation of the TCA 102, the IOSR 904 and M 604 circuitry and the connections between these circuits. During state 1104 the TCA operates to input PCI and output PCO, IOSR 904 operates to input PCO from the TCA and output PCI to M 604, and M 604 operates to pass the PCI output from IOSR 904 to the PCI input of TCA 102. During state 1104 the PCO outputs from PAT 902 can be monitored by an external tester or by monitoring circuitry in the device to verify that data is being correctly circulated from the TCA PCO outputs to the TCA PCI inputs via the IOSR 904 and M 604.

Figure 12:
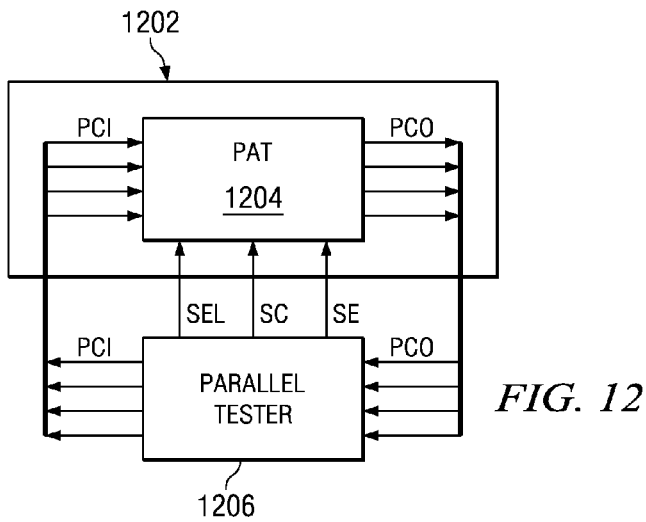
FIG. 12 illustrates a parallel test connection between a tester and a PAT within a device according to the disclosure.

FIG. 12 illustrates a device 1202 with a PAT 1204 coupled to a parallel tester 1206 via PCI, SEL, SC, SE, and PCO signals. PAT 1204 could be either PAT 602 of FIG. 6 or PAT 902 of FIG. 9. PAT 1204 is set to the parallel test mode by the SEL signal.

Figure 13:
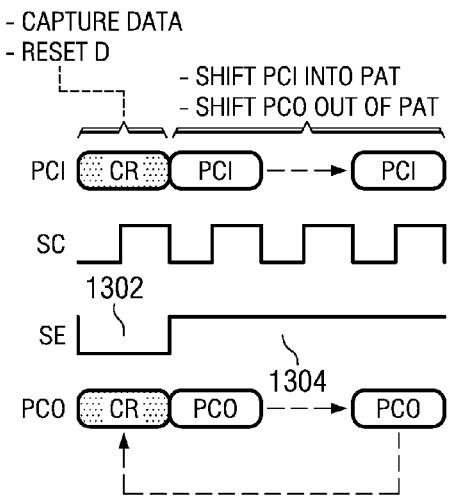
FIG. 13 illustrates the timing between the tester and device of FIG. 12 according to the disclosure.

FIG. 13 illustrates the scan cycle timing operation of PAT 1204 in the parallel test mode. As seen in FIG. 13, the PAT scan cycle capture and reset (CR) operation 1302 and shift operation 1304 timing from tester 1206 is the same as the TCA scan cycle capture and reset operation 502 and shift operation 504 timing from tester 404 of FIG. 5. The only difference between the PAT test arrangement of FIG. 12 and the TCA test arrangement of FIG. 4 is that tester 1206 provides the SEL signal to PAT 1204 to place the PAT in the parallel test mode.

Figure 14:
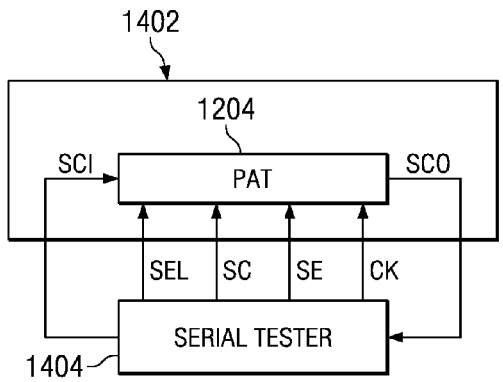
FIG. 14 illustrates a serial test connection between a tester and a PAT within a device according to the disclosure.

FIG. 14 illustrates a device 1402 with a PAT 1204 coupled to a serial tester 1404 via SCI, SEL, CK, SC, SE, and SCO signals. PAT 1204 is set to the serial test mode by the SEL signal. If PAT 1204 is PAT 602 of FIG. 6, the SCI input is used to serially input compressed input data to ISR 606 and the SCO is used to serially output compressed output data from OSR 608. If PAT 1204 is PAT 902 of FIG. 9, the SCI input is used to serially input compressed input data to IOSR 904 and the SCO is used to serially output compressed output data from IOSR 904.

Figure 15:
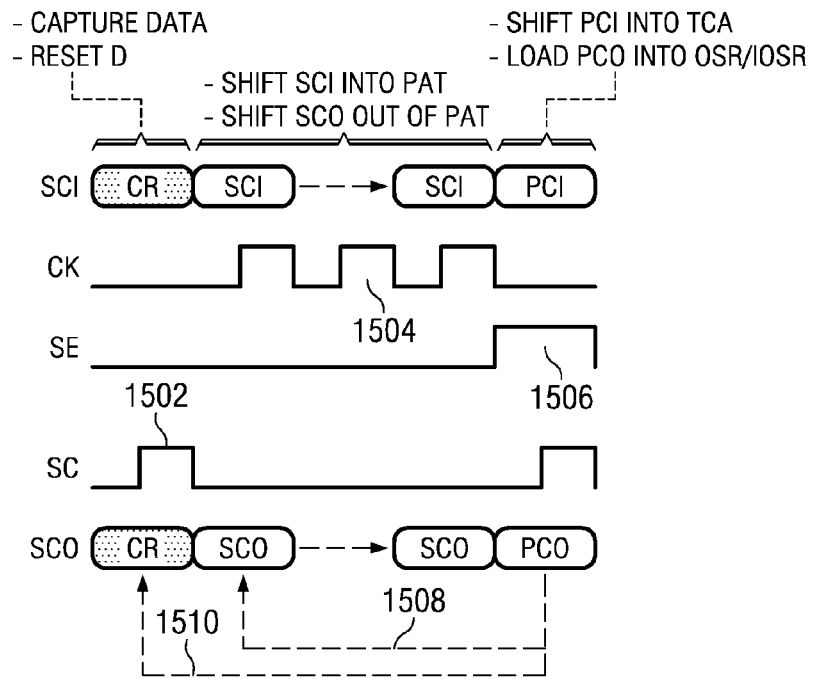
FIG. 15 illustrates the timing between the tester and device of FIG. 14 according to the disclosure.

FIG. 15 illustrates the scan cycle timing operation of PAT 1204 in the serial test mode. As seen in FIG. 15, the PAT capture and reset (CR) operation occurs at timing point 1502 where an SC clock occurs while the SE input is low. The PAT SCI input and SCO output shift operations occur at timing point 1504 where CK clocks occur while the SE input is low. At the end of the SCI and SCO shift operation 1504, the compressed input data shifted into the ISR 606 or IOSR 904 is shifted into the PCI input of the PAT's TCA 102, and the PCO output from the PAT's TCA 102 is loaded into the OSR 608 or IOSR 904. This TCA PCI input and PCO output operation occurs at timing point 1506 where the SE input is high and an SC clock occurs. From timing point 1506 the tester 1404 repeats, at timing point 1508, the serial SCI input and SCO output shift operation 1504 to input additional PCI input to the TCA 102 from the ISR 606 or IOSR 904 and output additional PCO output from the TCA 102 from the OSR 608 or IOSR 904. Timing points 1506 and 1504 repeat until all TCA PCI input and PCO output data of the shift operation of the TCA scan cycle has been completed. When the shift operation of the TCA scan cycle completes, the tester 1404 transitions, at timing point 1510, the PAT from timing point 1506 to timing point 1502 to perform the capture and reset (CR) operation at the beginning of the next TCA scan cycle. The above described scan cycle, comprising the PAT capture and reset (CR) timing operation 1502, the SCI input SCO output timing operation 1504, and the PCI input and PCO output timing operation 1506, repeats until all test patterns have been applied to the TCA 102 of PAT 1204.

Figure 16:
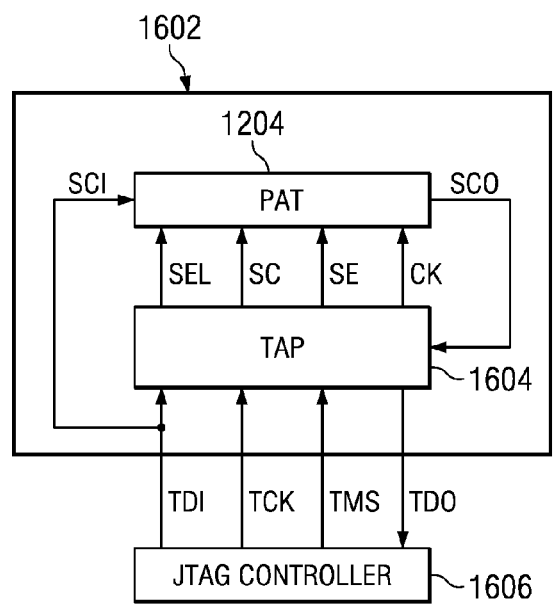
FIG. 16 illustrates a serial test connection between a JTAG controller and a PAT within a device according to the disclosure.

FIG. 16 illustrates an example of a device 1602 with a PAT 1204 being connected to an external JTAG controller 1606 via the device's test access port (TAP) 1604. The TAP 1604 is a well known device test interface defined in IEEE standard 1149.1. The interface between the JTAG controller 1606 and TAP 1604 includes test data input (TDI), test clock (TCK), test mode select (TMS), and test data output (TDO) signals. The TAP 1604 is adapted to interface with the PAT's SCI, SEL, SC, SE, CK and SCO signals. This example allows device manufacturer test patterns to be applied to the device PAT from a JTAG controller.

Figure 17:
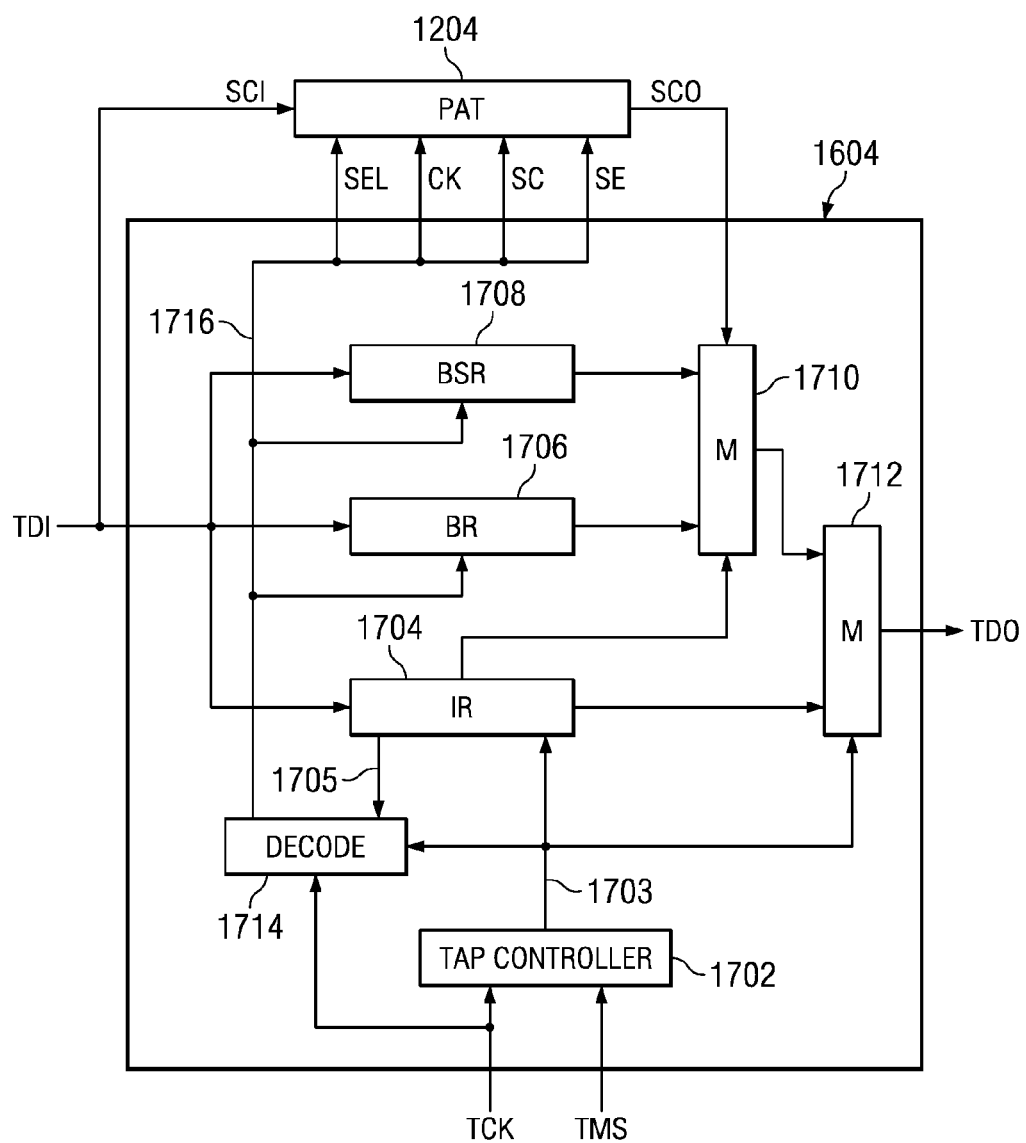
FIG. 17 illustrates a detail view of the 1149.1 test access port (TAP) of the device of FIG. 16 according to the disclosure.

FIG. 17 illustrates the TAP 1604 in more detail and its interface to PAT 1204. The TAP 1604 includes a TAP controller 1702, instruction register (IR) 1704, single bit bypass register (BR) 1706, boundary scan register (BSR) 1708, multiplexer 1710, multiplexer 1712, and decode circuit 1714, all connected as shown. The TAP controller 1702 responds to TCK and TMS to shift data through the IR 1704, the BR 1706, or the BSR 1708 from TDI to TDO according to the TAP controller state diagram of FIG. 18. During shift operations, multiplexers 1710 and 1712 couple the selected register's output to TDO. As seen, the PAT is interfaced to the TAP and operates as an additional data register that can be selected and accessed via TDI and TDO. The instruction shifted into the IR 1704 is input 1705 to the decode circuit 1714 which controls which data register (BR, BSR, or PAT) is selected for access. The decode circuit also receives the TCK and signals 1703 from the TAP controller 1702 to generate output control signals 1716 required to access a selected data register (BR, BSR, or PAT). As seen, when the PAT is selected the decoder circuit 714 provides the SEL, CK, SC and SE control signals to the PAT via bus 1716.

Figure 18:
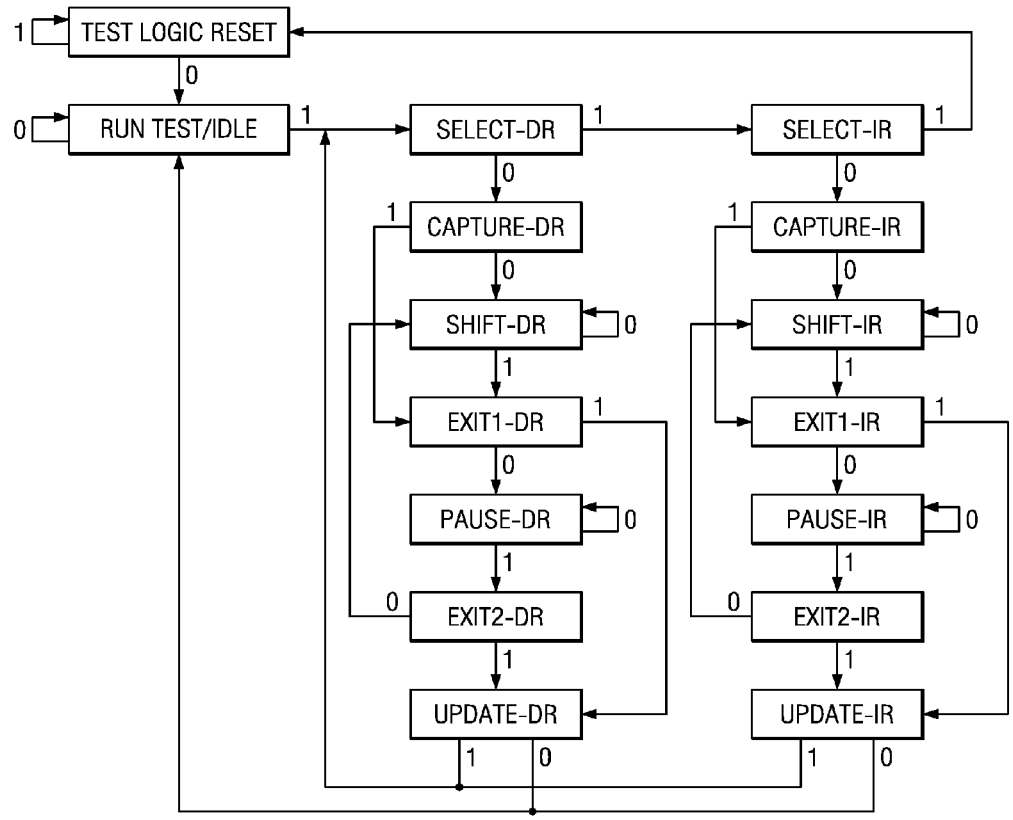
FIG. 18 illustrates the operational state diagram of the 1149.1 TAP controller of FIG. 17.
Figure 19:
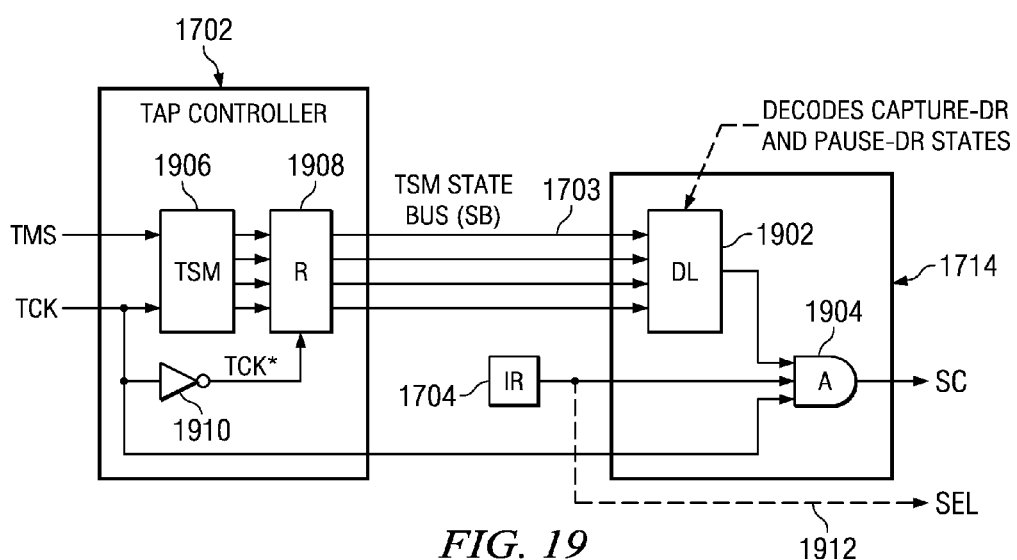
FIG. 19 illustrates additional TAP circuitry for providing a PAT scan clock (SC) signal according to the disclosure.

FIG. 19 illustrates one example, according to the disclosure, of how the PAT SC signal can be produced by adding circuitry and a PAT test instruction to TAP 1604. The TAP controller 1702 of TAP 1604 comprises a TAP state machine (TSM) 1906 and a state register (R) 1908. As seen in FIG. 18, the TAP controller's TSM has 16 states which are decoded by four state signals. When the TSM is transitioned into one of the 16 states, the four states signals are clocked into the state register (R) 1908 on the falling edge of TCK, via inverter 1910. The state signals from state register (R) 1908 are output to the decode logic (DL) 1902 of decode circuit 1714 on bus 1703. The decode circuit 1714 also inputs the TCK and a PAT test instruction signal from IR 1704. The decode logic 1902 outputs a signal to an input of And gate 1904 in decode logic 1714. The And gate 1904 inputs the PAT test instruction signal from IR 1704 and the TCK signal. When the TSM 1906 is in the Capture-DR or Pause-DR state the decode logic 1902 detects these states and sets its output to enable And gate 1904. If the PAT test instruction signal from IR 1704 is also set to enable And gate 1904, And gate 1904 will be enabled to pass the TCK signal to the SC output of And gate 1904. Thus TAP 1604 produces an SC clock output to PAT 1204 whenever the TSM 1906 is in the Capture-DR or Pause-DR state, the PAT test instruction signal from IR 1704 is set, and a TCK occurs.

Figure 20:
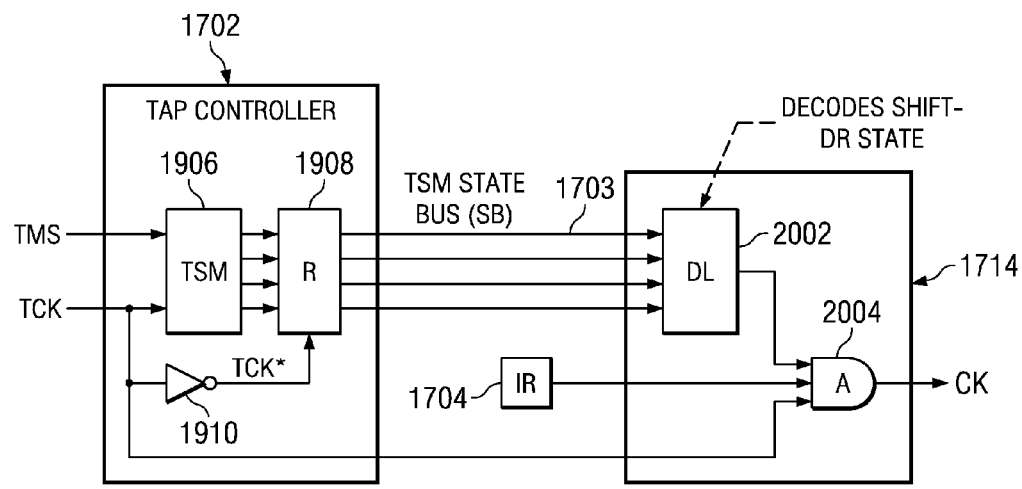
FIG. 20 illustrates additional TAP circuitry for providing a PAT clock (CK) signal according to the disclosure.

FIG. 20 illustrates one example, according to the disclosure, of how the PAT CK signal can be produced by adding circuitry and a PAT test instruction to TAP 1604. When the TSM 1906 of TAP controller 1702 transitions into the Shift-DR state the state signals from state register (R) 1908 are output to the decode logic (DL) 2002 of decode circuit 1714 on bus 1703. The decode circuit 1714 also inputs the TCK and the PAT test instruction signal from IR 1704. The decode logic 2002 outputs a signal to an input of And gate 2004 in decode logic 1714. The And gate 2004 also inputs the PAT test instruction signal from IR 1704 and the TCK signal. When the TSM 1906 is in the Shift-DR state the decode logic 2002 detects this state and sets its output to enable And gate 2004. If the PAT test instruction signal from IR 1704 is also set to enable And gate 2004, the And gate will be enabled to pass the TCK signal to the CK output of And gate 2004. Thus TAP 1604 produces a CK clock output to PAT 1204 whenever the TSM 1906 is in the Shift-DR state, the PAT test instruction signal from IR 1704 is set, and a TCK occurs.

Figure 21:
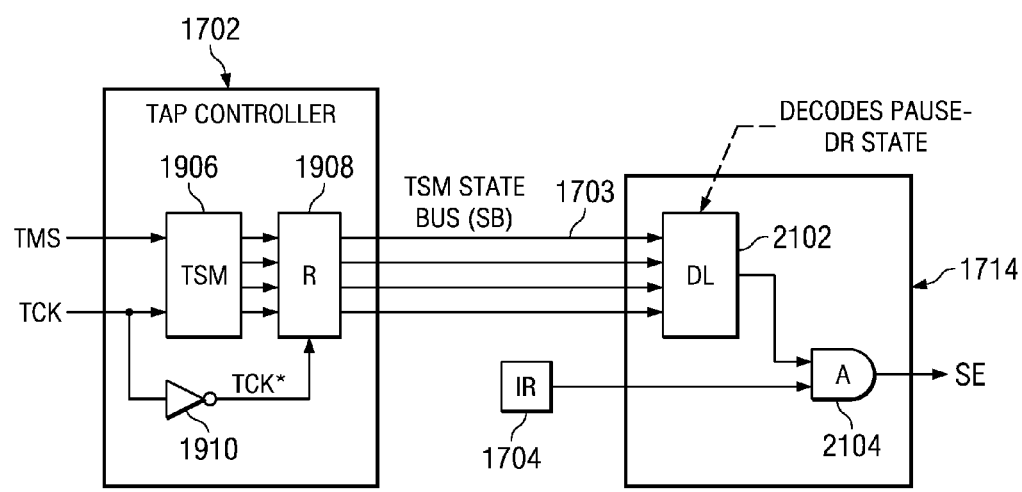
FIG. 21 illustrates additional TAP circuitry for providing a PAT scan enable (SE) signal according to the disclosure.

FIG. 21 illustrates one example, according to the disclosure, of how the PAT SE signal can be produced by adding circuitry and a PAT test instruction to TAP 1604. When the TSM 1906 of TAP controller 1702 transitions into the Pause-DR state the state signals from state register (R) 1908 are output to the decode logic (DL) 2102 of decode circuit 1714 on bus 1703. The decode circuit 1714 also inputs the PAT test instruction signal from IR 1704. The decode logic 2102 outputs a signal to an input of And gate 2104 in decode logic 1714. The And gate 2104 also inputs the PAT test instruction signal from IR 1704. When the TSM 1906 is in the Pause-DR state the decode logic 2102 detects this state and sets its output to enable And gate 2104. If the PAT test instruction signal from IR 1704 is also set to enable And gate 2004, the SE output of And gate 2104 will be set high. Thus TAP 1604 produces a high output of SE whenever the TSM 1906 is in the Pause-DR state and the PAT test instruction signal from IR 1704 is set.

As shown in dotted line in FIG. 19, the PAT test instruction signal from IR 1704 that enables And gates 1904, 2004, and 2104 can also be used to set the PAT SEL signal to a state that places the PAT 1204 in the serial test mode described in regard to PAT 602 of FIGS. 6 and 7 and PAT 902 of FIGS. 9 and 10. If the PAT 1204 is always to be tested in the serial test mode via the JTAG TAP 1604, the SEL signal can be hardwired to a state that selects the PAT serial test mode, instead of using the PAT test instruction signal to set the SEL signal. One reason for allowing the PAT test instruction signal to set the SEL signal to the serial test mode, instead of hardwiring the SEL signal to the serial test mode, is that it enables a different PAT test instruction to be loaded into IR 1704 for setting the SEL signal to the parallel test mode. For example, during device production testing it may be desirable, for device test time reduction reasons, to test the PAT in the parallel test mode as described in regard to FIGS. 12 and 13. If used for production testing the different PAT test instruction can set the PAT to its parallel test mode and couple the PAT's PCI, SC, SE, and PCO signals to a production tester, via device terminals, to enable the PAT to be tested using the test timing diagrams shown in FIG. 13.

Figure 22:
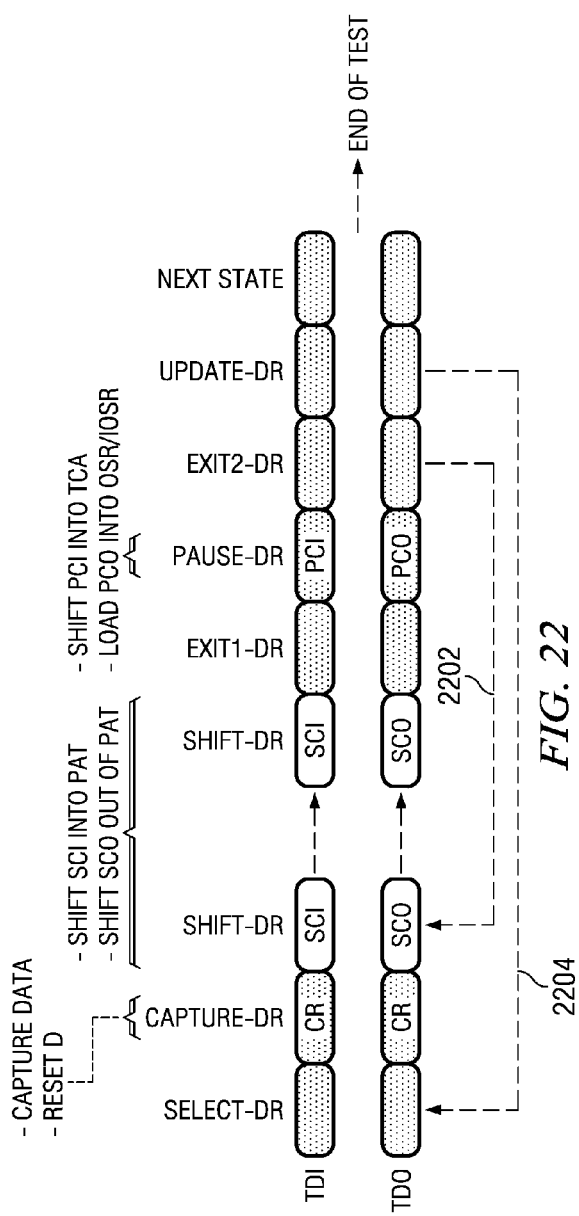
FIG. 22 illustrates TAP controller state transitions for serially testing a PAT according to the disclosure.

FIG. 22 illustrates the TAP controller state transitions of FIG. 18 that enable a PAT 1204 that has been placed in the serial test mode to be tested by a JTAG controller 1606 via the device TAP 1604 of FIG. 16 that has been modified with the additional circuitry and PAT test instruction described in regard to FIGS. 19-21. Prior to executing these TAP state transitions, the PAT test instruction described in FIGS. 19-21 is loaded into the TAP IR 1704. As seen the PAT test begins by transitioning the TAP controller into the Capture-DR state via the Select-DR state. In the Capture-DR state the capture and reset (CR) operation of the first scan cycle is performed. The TAP controller is then transitioned into the Shift-DR state to shift in SCI data from TDI and shift out SCO data on TDO. Next the TAP controller is transitioned into the Pause-DR state via the Exit1-DR state to input PCI data to the TCA from the ISR 606 or IOSR 904 and load PCO output data from the TCA into the OSR 608 or IOSR 904. The TAP controller repeatedly transitions 2202 from the Pause-DR state to the Shift-DR state, via the Exit2-DR state, until the PAT's TCA has been filled with PCI input data and emptied of PCO output data. When the filling and emptying of the PAT's TCA is complete, which is the shift operation of the first PAT scan cycle, the TAP controller transitions 2204 from the Pause-DR state to the Capture-DR state, via the Exit2-DR, Update-DR and Select-DR states, to perform the capture and reset (CR) operation of the next scan cycle. This process of performing the capture and reset (CR) operation of a scan cycle in the Capture-DR state and the shift operation of the scan cycle by repeatedly transitioning between the Pause-DR and Shift-DR states continues until all scan cycle test patterns have been applied to the PAT's TCA.

Figure 23:
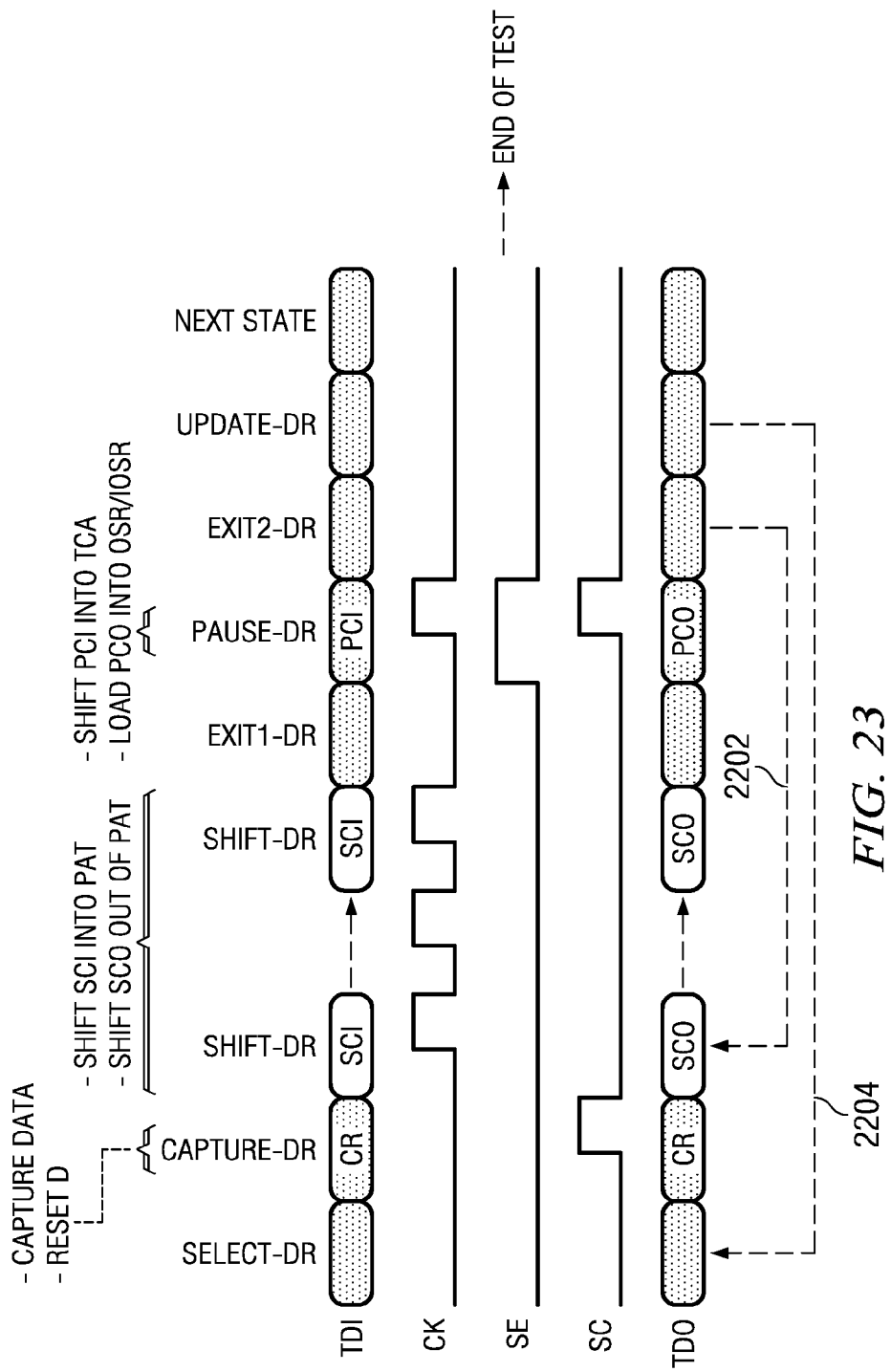
FIG. 23 illustrates the operation of the CK, SC, and SE signals during the TAP controller state transitions of FIG. 22.

FIG. 23 is provided to illustrate how the TAP 1604, modified as described in FIGS. 19-21, controls the SC, CK and SE signal inputs to the PAT 1204 during the TAP controller state transitions shown in FIG. 22. The SC signal is produced by the method described in regard to the circuit example of FIG. 19. The CK signal is produced by the method described in regard to the circuit example of FIG. 20. The SE signal is produced by the method described in regard to the circuit example of FIG. 21. The SC, CK and SE signals may also be produced by other circuit methods as well.

The TAP 1604 control of a device PAT 1204, as described in TAP controller 1702 state transitions of FIGS. 22 and 23, works well when the JTAG controller 1606 can be connected directly to the device TAP as shown in FIG. 16. However when the device with the PAT 1204 exists in a JTAG daisy-chain arrangement with other devices, the TAP controller state transitions of FIGS. 22 and 23 can be improved upon as will be described below in regard to FIGS. 24-40.

PAT Testing in JTAG Daisy-Chain Arrangements

Figure 24:
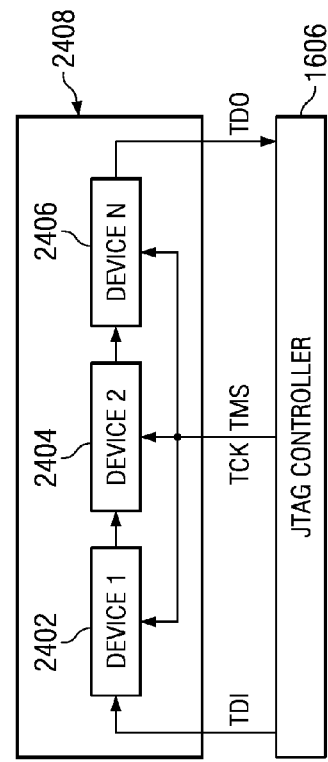
FIG. 24 illustrates a JTAG controller accessing a group of devices in a daisy-chain arrangement.

FIG. 24 illustrates N devices 2402-2406 in a serial daisy-chain arrangement 2408 that is connected to a JTAG controller 1606. Each device includes a TAP 1604 including TDI, TCK, TMS and TDO interface signals. As seen the first device 2402 is connected to the TDI output from the JTAG controller and the last device 2406 is connected to the TDO input to the JTAG controller. Intermediate devices 2404 are connected in series with the first and last devices via TDI and TDO. All devices are connected to the TMS and TCK outputs from the JTAG controller. This configuration between the JTAG controller and series of daisy-chained devices is well known in the industry.

The arrangement 2408 of devices 2402-2406 could be; (1) an arrangement of embedded core circuits within an IC, (2) an arrangement of ICs in an IC manufacturing test environment, (3) an arrangement of ICs in a customer's system such as a computer or cell phone, or (4) any other arrangement where the devices 2402-2406 need to be connected in series and accessed by a JTAG controller for test, emulation, debug, and/or other operations.

Figure 25:
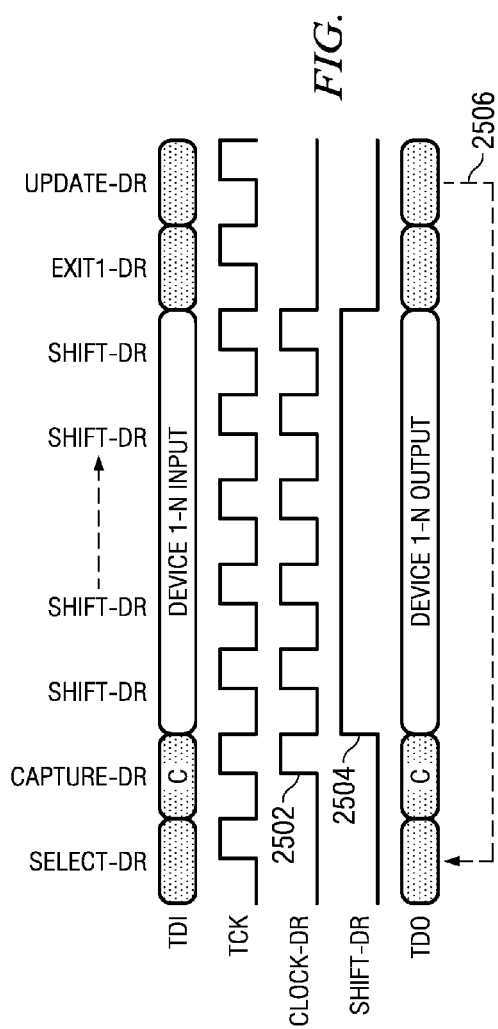
FIG. 25 illustrates the TAP controller state transitions during JTAG controller access of the devices in the daisy-chain arrangement of FIG. 24.

FIG. 25 illustrates an example JTAG data register scan cycle whereby data registers in all devices 2402-2406 in arrangement 2408 capture (C) data at time 2502 then shift data from the JTAG controller's TDI output to the JTAG controller's TDO input at time 2504. The scan cycle can be repeated 2506 as required by transitioning the device TAPs through TAP states Exit1-DR, Update-DR, and Select-DR to re-enter the Capture-DR state.

Figure 26:
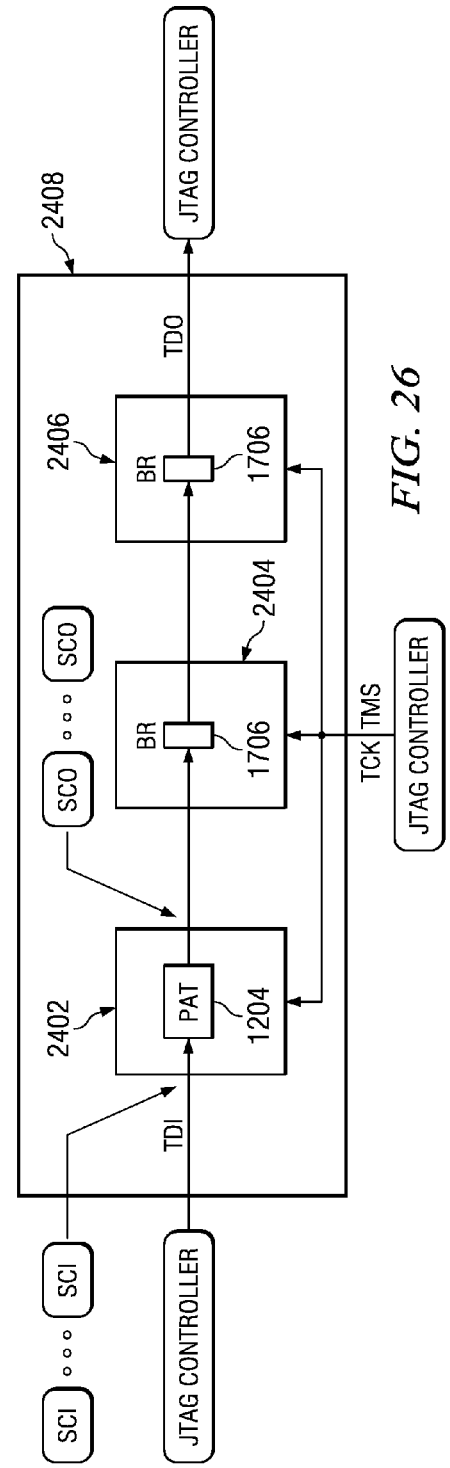
FIG. 26 illustrates a JTAG controller accessing the PAT of a first device in a daisy-chain arrangement of devices according to the disclosure.

FIG. 26 illustrates arrangement 2408 with the IR 1704 of the first device 2402 loaded with the previously described PAT test instruction, and the IRs 1704 of trailing devices 2404-2406 loaded with the standard JTAG Bypass instruction. As previously described the PAT test instruction enables the added TAP circuitry described in FIGS. 19-21, places the PAT 1204 of device 2402 in the serial test mode, and selects the PAT between the TDI and TDO terminals of device 2402. The Bypass instruction in trailing devices 2404-2406 selects the single bit bypass register (BR) 1706 between the device's TDI and TDO terminals.

Figure 27:
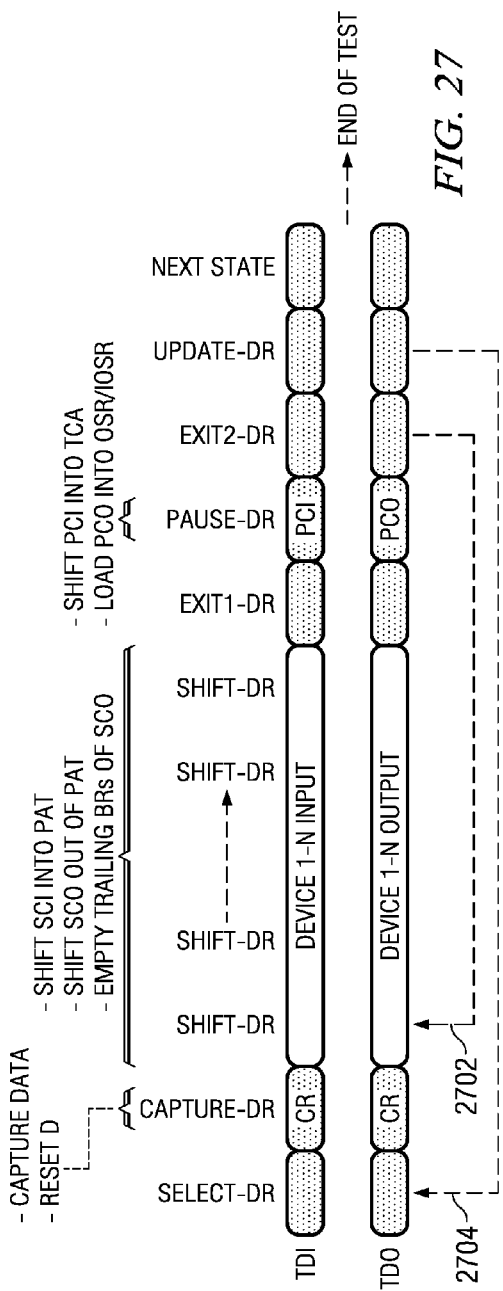
FIG. 27 illustrates the TAP controller state transitions during JTAG controller access of the PAT of FIG. 26 according to the disclosure.

FIG. 27 illustrates the TAP controller state transitions of FIG. 18 that enable PAT 1204 of device 2402 to be tested in the daisy-chain arrangement 2408 by a JTAG controller 1606. As seen the PAT test scan cycle begins by transitioning the device 2402-2406 TAP controllers into the Capture-DR state via the Select-DR state. In the Capture-DR state the TAP controller of device 2402 performs a capture and reset (CR) operation to start the first PAT scan cycle. The TAP controllers of the other devices 2404-2406 perform a capture operation to load their BRs with a logic zero, as defined in IEEE 1149.1. The TAP controllers are then transitioned into the Shift-DR state to shift in data from TDI and shift out data on TDO. As seen, during the Shift-DR state SCI data is input to device 2402 from the TDI output of the JTAG controller, SCO data is output from device 2402 to the BRs of trailing devices 2404-2406 to be output to the TDO input of the JTAG controller. Next the TAP controllers are transitioned into the Pause-DR state via the Exit1-DR state. During the Pause-DR state the TAP of device 2402 shifts PCI data to the TCA of PAT 1204 from the ISR 606 or IOSR 904 and loads PCO data from the TCA of PAT 1204 into the OSR 608 or IOSR 904. The TAP controllers of devices 2404-2406 halt shifting their BRs during the Pause-DR state. The TAP controllers are repeatedly transitioned at timing point 2702 from the Pause-DR state to the Shift-DR state, via the Exit2-DR state, until the device 2402 PAT's TCA has been filled with PCI input data and emptied of PCO output data. When the filling and emptying of the PAT's TCA is complete, which is the shift operation of the first PAT scan cycle, the TAP controllers are transitioned at timing point 2704 from the Pause-DR state to the Capture-DR state, via the Exit2-DR, Update-DR and Select-DR states, to perform the capture and reset (CR) operation of the next PAT scan cycle. This process of performing the capture and reset (CR) operation of a PAT scan cycle in the Capture-DR state and the shift operation of the PAT scan cycle by repeatedly transitioning between the Pause-DR and Shift-DR states continues until all scan cycle test patterns have been applied to the PAT's TCA.

As can be seen from the PAT scan cycle timing of FIG. 27, each PAT scan cycle must include an additional number of shift operations to allow the SCO data in the trailing device BRs to be output to the TDO input of the JTAG controller. For example, if 20 trailing device 2404-2406 BRs existed in arrangement 2408, each scan cycle would need to include an additional 20 shift operations to empty the SCO data from the 20 BRs. Lengthening each scan cycle by 20 shift operations increases the time it takes to apply the device 2402 PAT test patterns and thus introduces a test time problem.

Another problem is that the PAT test patterns must be modified for the number of trailing devices 2404-2406 in a given arrangement 2408. For example, there will be a uniquely modified PAT test pattern set for each arrangement that has a different number of trailing device BRs. This means that the manufacturer/provider of device 2402 will need to provide to customers who use device 2402 a customized test pattern set for testing the PAT of device 2402 in each customer arrangement 2408 the device 2402 is used in.

Figure 28:
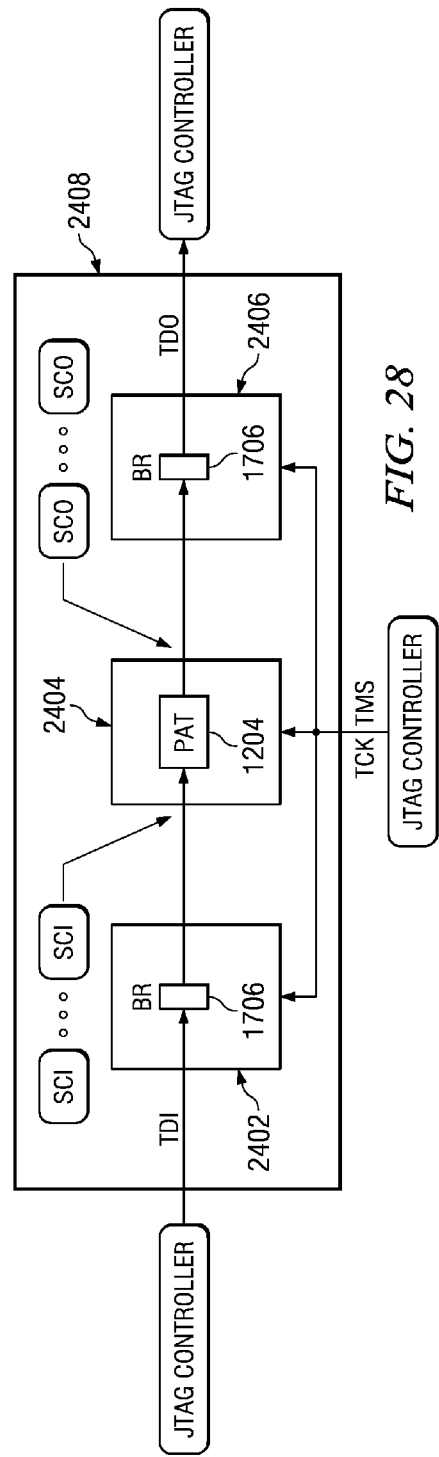
FIG. 28 illustrates a JTAG controller accessing the PAT of an intermediate device in a daisy-chain arrangement of devices according to the disclosure.

FIG. 28 illustrates arrangement 2408 with the IR 1704 of an intermediate device 2404 loaded with the previously described PAT test instruction, and the IRs 1704 of leading 2402 and trailing 2406 devices loaded with the standard JTAG Bypass instruction. As previously described the PAT test instruction enables the added TAP circuitry described in FIGS. 19-21, places the PAT 1204 of device 2404 in the serial test mode, and selects the PAT between the TDI and TDO terminals of device 2404. The Bypass instruction in leading 2402 and trailing 2406 devices select the single bit bypass register (BR) 1706 between the device's TDI and TDO terminals.

Figure 29:
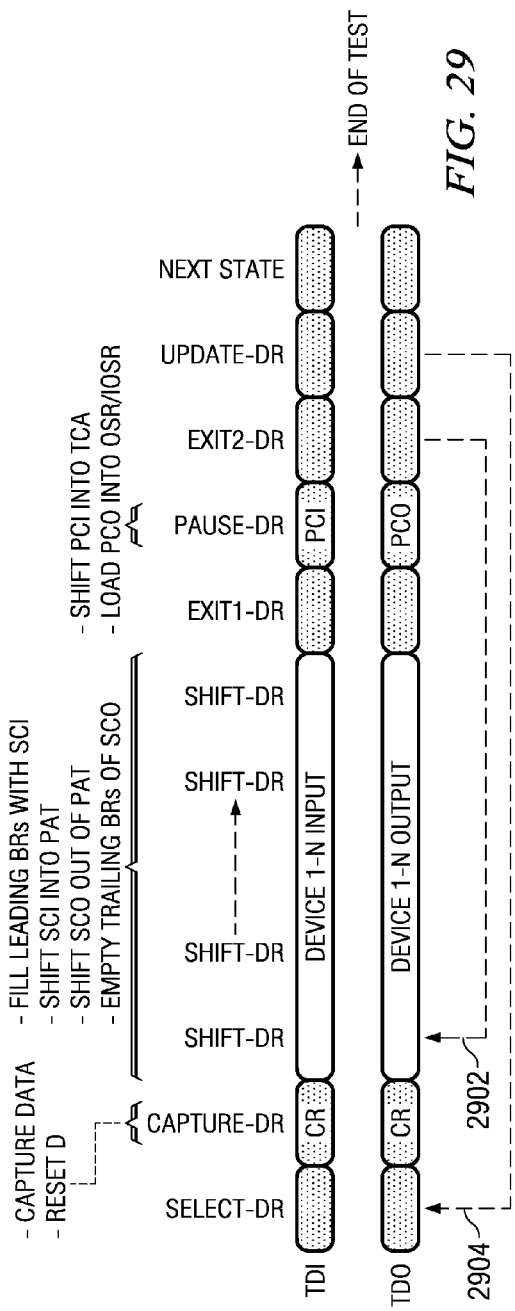
FIG. 29 illustrates the TAP controller state transitions during JTAG controller access of the PAT of FIG. 28 according to the disclosure.

FIG. 29 illustrates the TAP controller state transitions of FIG. 18 that enable PAT 1204 of device 2404 to be tested in the daisy-chain arrangement 2408 by a JTAG controller 1606. As seen the PAT test scan cycle begins by transitioning the device 2402-2406 TAP controllers into the Capture-DR state via the Select-DR state. In the Capture-DR state the TAP controller of device 2404 performs a capture and reset (CR) operation to start the first PAT scan cycle. The TAP controllers of the leading and trailing devices perform a capture operation to load their BRs with a logic zero, as defined in IEEE 1149.1. The TAP controllers are then transitioned into the Shift-DR state to shift in data from TDI and shift out data on TDO. As seen, during the Shift-DR state SCI data is input to the BRs of leading devices 2402 from the TDI output of the JTAG controller, device 2404 inputs the SCI data from the leading devices to PAT 1204 and outputs SCO data from PAT 1204 to the BRs of trailing devices 2406 to be output to the TDO input of the JTAG controller. Next the TAP controllers are transitioned into the Pause-DR state via the Exit1-DR state. During the Pause-DR state the TAP of device 2404 shifts PCI data to the TCA of PAT 1204 from the ISR 606 or IOSR 904 and loads PCO data from the TCA of PAT 1204 into the OSR 608 or IOSR 904. The TAP controllers of leading 2402 and trailing 2406 devices halt shifting their BRs during the Pause-DR state. The TAP controllers are repeatedly transitioned at timing point 2902 from the Pause-DR state to the Shift-DR state, via the Exit2-DR state, until the device 2404 PAT's TCA has been filled with PCI input data and emptied of PCO output data. When the filling and emptying of the PAT's TCA is complete, which is the shift operation of the first PAT scan cycle, the TAP controllers are transitioned at timing point 2904 from the Pause-DR state to the Capture-DR state, via the Exit2-DR, Update-DR and Select-DR states, to perform the capture and reset (CR) operation of the next PAT scan cycle. This process of performing the capture and reset (CR) operation of a PAT scan cycle in the Capture-DR state and the shift operation of the PAT scan cycle by repeatedly transitioning between the Pause-DR and Shift-DR states continues until all scan cycle test patterns have been applied to the PAT's TCA.

As can be seen from the PAT scan cycle timing of FIG. 29, each PAT scan cycle must include an additional number of shift operations to allow the SCI data from the TDI output of the JTAG controller to pass through the BRs of leading devices 2402 to be input to device 2404 and to allow the SCO data from device 2404 to pass through the BRs of trailing devices 2406 to be output to the TDO input of the JTAG controller. For example, if 20 leading devices and 20 trailing devices existed in arrangement 2408, each scan cycle would need to include an additional 40 shift operations to fill the leading devices with SCI data and empty the trailing devices of SCO data. Lengthening each scan cycle by 40 shift operations increases the time it takes to apply the device 2404 PAT test patterns and thus introduces a test time problem.

Another problem is that the PAT test patterns must be modified for the number of leading 2402 and trailing 2406 devices in a given arrangement 2408. For example, there will be a uniquely modified PAT test pattern set for each arrangement that has a different number of leading and trailing device BRs. This means that the manufacturer/provider of device 2404 will need to provide to customers who use device 2404 a customized test pattern set for testing the PAT of device 2404 in each customer arrangement 2408 the device 2404 is used in.

Figure 30:
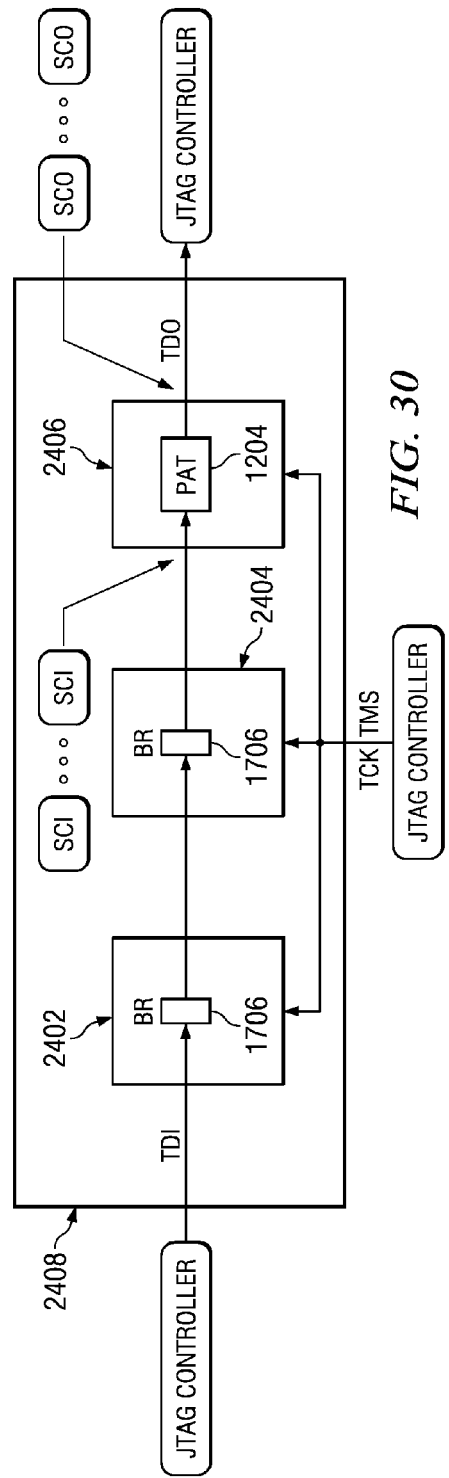
FIG. 30 illustrates a JTAG controller accessing the PAT of a last device in a daisy-chain arrangement of devices according to the disclosure.

FIG. 30 illustrates arrangement 2408 with the IR 1704 of the last device 2406 loaded with the previously described PAT test instruction, and the IRs 1704 of leading devices 2402-2404 loaded with the standard JTAG Bypass instruction. As previously described the PAT test instruction enables the added TAP circuitry described in FIGS. 19-21, places the PAT 1204 of device 2406 in the serial test mode, and selects the PAT between the TDI and TDO terminals of device 2406. The Bypass instruction in leading devices 2402-2404 selects the single bit bypass register (BR) 1706 between the device's TDI and TDO terminals.

Figure 31:
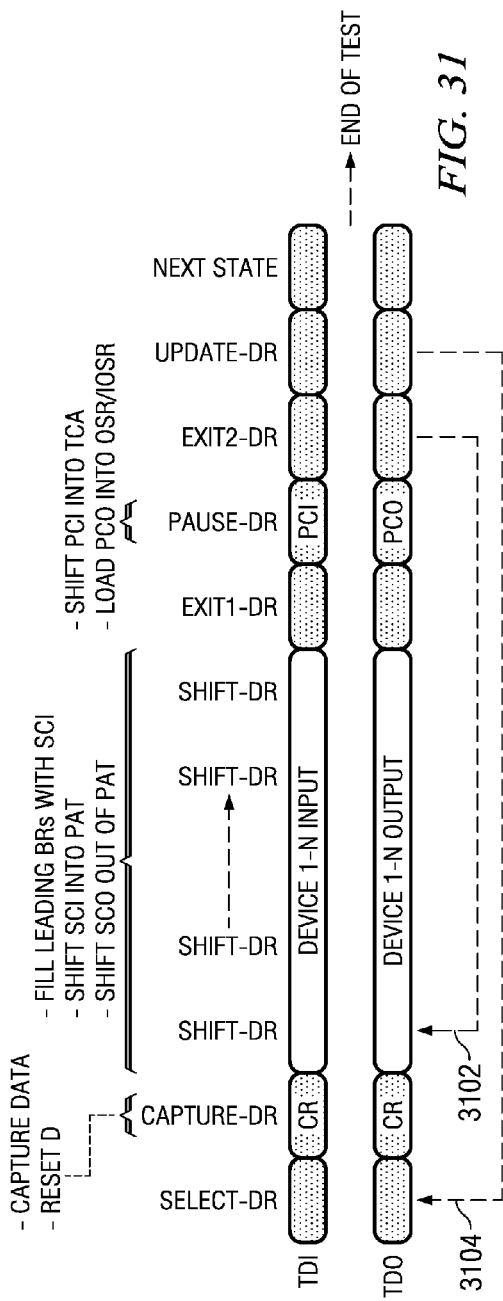
FIG. 31 illustrates the TAP controller state transitions during JTAG controller access of the PAT of FIG. 30 according to the disclosure.

FIG. 31 illustrates the TAP controller state transitions of FIG. 18 that enable PAT 1204 of device 2406 to be tested in the daisy-chain arrangement 2408 by a JTAG controller 1606. As seen the PAT test scan cycle begins by transitioning the device 2402-2406 TAP controllers into the Capture-DR state via the Select-DR state. In the Capture-DR state the TAP controller of device 2406 performs a capture and reset (CR) operation to start the first PAT scan cycle. The TAP controllers of the other devices 2402-2404 perform a capture operation to load their BRs with a logic zero, as defined in IEEE 1149.1. The TAP controllers are then transitioned into the Shift-DR state to shift in data from TDI and shift out data on TDO. As seen, during the Shift-DR state SCI data is input to the BRs of leading devices 2402-2404 from the TDI output of the JTAG controller, and device 2406 inputs the SCI data from the leading devices to PAT 1204 and outputs SCO data from PAT 1204 to the TDO input of the JTAG controller. Next the TAP controllers are transitioned into the Pause-DR state via the Exit1-DR state. During the Pause-DR state the TAP of device 2406 shifts PCI data to the TCA of PAT 1204 from the ISR 606 or IOSR 904 and loads PCO data from the TCA of PAT 1204 into the OSR 608 or IOSR 904. The TAP controllers of leading device 2402-2402 halt shifting their BRs during the Pause-DR state. The TAP controllers are repeatedly transitioned at timing point 3102 from the Pause-DR state to the Shift-DR state, via the Exit2-DR state, until the device 2406 PAT's TCA has been filled with PCI input data and emptied of PCO output data. When the filling and emptying of the PAT's TCA is complete, which is the shift operation of the first PAT scan cycle, the TAP controllers are transitioned at timing point 3104 from the Pause-DR state to the Capture-DR state, via the Exit2-DR, Update-DR and Select-DR states, to perform the capture and reset (CR) operation of the next PAT scan cycle. This process of performing the capture and reset (CR) operation of a PAT scan cycle in the Capture-DR state and the shift operation of the PAT scan cycle by repeatedly transitioning between the Pause-DR and Shift-DR states continues until all scan cycle test patterns have been applied to the PAT's TCA.

As can be seen from the PAT scan cycle timing of FIG. 31, each PAT scan cycle must include an additional number of shift operations to allow the SCI data from the JTAG controller to be shifted through the leading device BRs to be input to the SCI input of the device 2406 PAT. For example, if 20 leading devices 2402-2404 existed in arrangement 2408, each scan cycle would need to include an additional 20 shift operations to fill the SCI data into the 20 device BRs. Lengthening each scan cycle by 20 shift operations increases the time it takes to apply the device 2402 PAT test patterns and thus introduces a test time problem.

Another problem is that the PAT test patterns must be modified for the number of leading devices 2402-2404 in a given arrangement 2408. For example, there will be a uniquely modified PAT test pattern set for each arrangement that has a different number of leading device BRs. This means that the manufacturer/provider of device 2406 will need to provide to customers who use device 2406 a customized test pattern set for testing the PAT of device 2406 in each customer arrangement 2408 the device 2406 is used in.

In addition to the above described need to modify the device manufacturer's PAT test patterns to include additional shift operations for leading and/or trailing BRs, the arrangements 2408 of FIGS. 28 and 30 introduce an additional PAT test problem, as described below.

A manufacturer that produces and tests a device containing a PAT 1204 that is testable via a JTAG controller, according to this disclosure, will typically produce device test patterns that test the PAT of the device using the direct device to JTAG controller arrangement of FIG. 16, whereby the device is directly connected to the JTAG controller via the TDI, TCK, TMS, and TDO signals. In this arrangement the device PAT 1204 expects to immediately receive the SCI data at the beginning of each PAT 1204 scan cycle shift operation, which comprises the Shift-DR state of FIGS. 22 and 23 to serialize the SCI data into the ISR/IOSR followed by the Pause-DR state of FIGS. 22 and 23 to input the PCI data from the ISR/IOSR to the PAT's TCA. However, as can be seen in the daisy-chain arrangements of FIGS. 28 and 30, the PATs of devices 2404 and 2406 input bypass bits (BB) from one or more leading device bypass registers (BR) at the start of each PAT 1204 scan cycle shift operation, instead of the SCI data from the direct JTAG controller interface of FIG. 16.

As previously mentioned, and in accordance with IEEE Standard 1149.1, the bypass register (BR) of a device containing the standard Bypass Instruction is loaded with a logic zero during the Capture-DR state of the TAP state diagram of FIG. 18. According to this disclosure, and during the Shift-DR state of say FIG. 29 the device 2404 PAT will input at least one logic zero BB prior to inputting the SCI data. Thus the PAT's TCA decompressor 104, instead of immediately receiving the SCI data from the JTAG controller 1606 as shown in the direct connection of FIG. 16, receives a stream of one or more logic zero bypass bits (BB) from one or more leading devices prior to receiving the actual manufacturer PAT test pattern set.

Since the decompressor 104 is clocked by SC during PCI input and PCI output operations of FIGS. 29 and 31 it responds to the logic low BBs to start producing pattern outputs to the SI inputs of the parallel scan paths, as described previously in regard to FIG. 2. The input of the logic zero BBs, prior to input of the CI data, will cause the decompressor 104 to advance from its reset state (starting seed state) to some other state determined by the number of BBs the decompressor receives. When the decompressor finally starts receiving CI data from the JTAG controller, it will be in a state that is different from its intended starting seed state. Since the decompressor will not be in the expected starting seed state, the device manufacturer's PAT test patterns will not be able to control the decompressor via the CI input to produce the intended stimulus outputs to the parallel scan paths, which invalidates the PAT test.

While it is possible to create a different PAT test pattern set that anticipates the decompressor starting in a state different from its intended starting state, there would need to be a different PAT test pattern set for each arrangement 2408 the device is placed in. For example one user of a manufactured device (customer 1) may place the device in an arrangement 2408 with 10 leading devices, while another user of the same manufactured device (customer 2) may place the device in an arrangement 2408 with 20 leading devices. To support device PAT testing for both customers, the device manufacturer would have to provide a first device PAT test pattern set for the arrangement 2408 used by customer 1 and a second device PAT test pattern set for arrangement used by customer 2. Additional PAT test patterns would be required for each different arrangement used by other customers.

As can be seen, the modified manufacturer's PAT test patterns described above extends the time it takes to test a device's PAT since the shift phase of each scan cycle is increased by the number of BRs in the arrangement 2408. Also having to provide multiple modified PAT test pattern sets to customers is problematic.

The present disclosure, as described in additional embodiments of FIGS. 32-40 below, provides a method of modifying the operation of a device TAP 1604 to enable the device's PAT to be tested, in either the manufacturing test arrangement of FIG. 16 or the daisy-chain JTAG test arrangement 2408 of FIG. 24, using the same PAT test pattern set. Additionally, the method enables the device PAT test times of the manufacturing test (FIG. 16) and daisy-chain test (FIG. 24) to be almost the same. This method provides a solution to the above mentioned need of having to modify and provide multiple PAT test pattern sets.

Improved PAT Testing in a Daisy-Chain Arrangement

Figure 32:
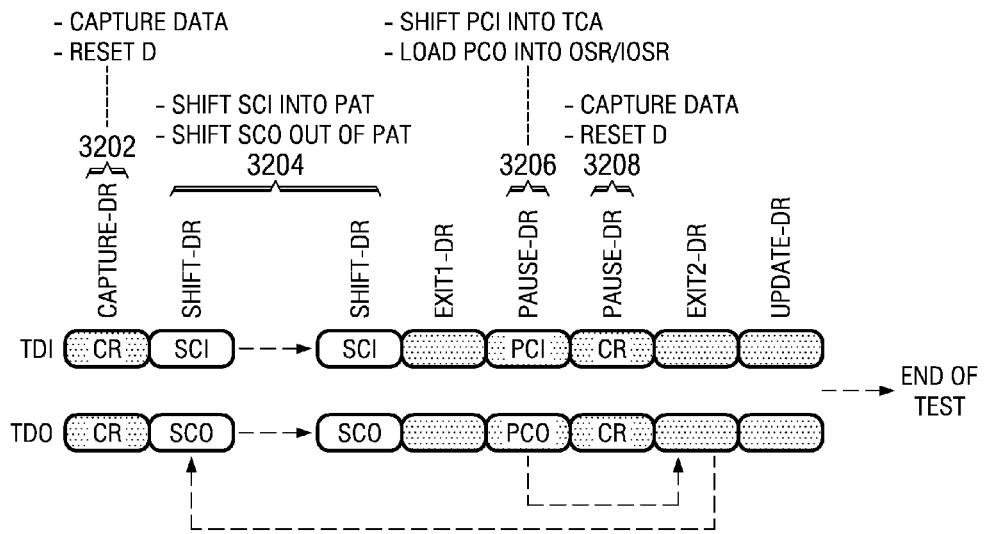
FIG. 32 illustrates alternate TAP controller state transitions for serially testing a PAT according to the disclosure.

FIG. 32 illustrates the TAP controller state transitions of FIG. 18 that enable a PAT 1204 that has been placed in the serial test mode to be tested by a JTAG controller 1606 via a modified device TAP 1604 of FIG. 16. As seen the PAT test begins by transitioning the modified TAP controller 1604 into the Capture-DR state 3202 via the Select-DR state. In the Capture-DR state the previously described capture and reset (CR) operation is performed. The TAP controller is then transitioned into the Shift-DR state 3204 to shift in SCI data from TDI and shift out SCO data on TDO. Next the TAP controller is transitioned into a first Pause-DR state 3206 via the Exit1-DR state to perform the previously described TCA PCI input and PCO output operation. This initial PAT scan cycle comprising the CR operation in the Capture-DR state 3202, the SCI input and SCO output shift operation in the Shift-DR state 3204, and PCI input and PCO output operation in the first Pause-DR state 3206, is performed once at the beginning of the PAT test. Next the TAP controller is transitioned (looped) into a second Pause-DR state 3208. During the second Pause-DR state 3208, the modified TAP 1604 outputs control to cause a capture and reset (CR) operation to occur. The CR operation that occurs during the second Pause-DR state 3208 is the CR operation of the first PAT scan cycle. The modified TAP controller 1604 then transitions from the second Pause-DR state to the Shift-DR state 3204 via the Exit2-DR state to shift in SCI data from TDI and shift out SCO data on TDO. Next the TAP controller is transitions to first Pause-DR state 3206 via the Exit1-DR state to input PCI data to the TCA from the ISR 606 or IOSR 904 and load PCO output data from the TCA into the OSR 608 or IOSR 904. The TAP controller repeatedly transitions from the first Pause-DR state 3206 to the Shift-DR state 3204, via the Exit2-DR state, until the PAT's TCA has been filled with PCI input data and emptied of PCO output data. Entry into the second Pause-DR state 3208 is avoided during this repeated transitioning between the first Pause-DR state 3206 and Shift-DR state 3204. When the filling and emptying of the PAT's TCA is complete, which is the shift operation of the first PAT scan cycle, the TAP controller transitions (loops) from the first Pause-DR state 3206 to the second Pause-DR state 3208 to perform the capture and reset (CR) operation of the next scan cycle. This process of performing the capture and reset (CR) operation of a PAT scan cycle during the second Pause-DR state 3208 and performing the shift operation of a PAT scan cycle by repeatedly transitioning between the first Pause-DR state 3206 and the Shift-DR state 3204 continues until all scan cycle test patterns have been applied to the PAT's TCA.

Figure 33:
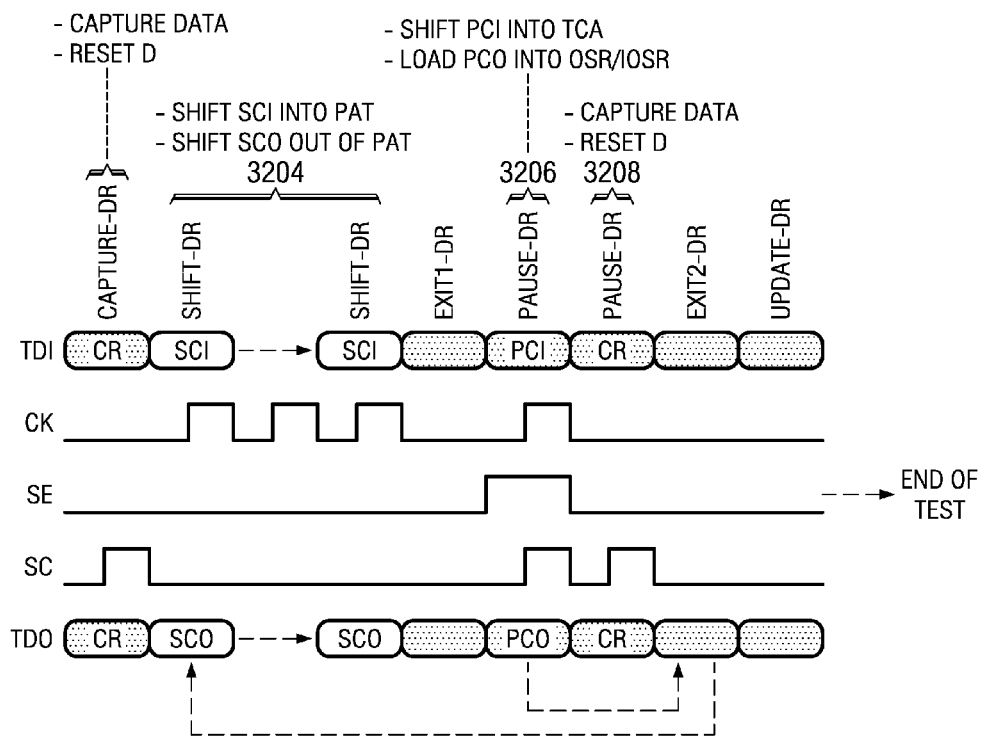
FIG. 33 illustrates the operation of the CK, SC, and SE signals during the alternate TAP controller state transitions of FIG. 32.

FIG. 33 is provided to illustrate how the modified TAP 1604, controls the SC, CK and SE signal inputs to the PAT 1204 of FIG. 16 during the TAP controller state transitions shown in FIG. 22. As described previously in regard to FIG. 23, the SC signal is produced by the method described in regard to the circuit example of FIG. 19. As described previously in regard to FIG. 23 the CK signal is produced by the method described in regard to the circuit example of FIG. 20. The SE signal is produced by an alternate SE control circuit added to the TAP 1604 in substitution for the SE control circuit described previously in regard to FIG. 21. This alternate SE control circuit, as described in FIG. 34 below, enables the second Pause-DR state 3208 to be used to control the SE signal to perform the PAT scan cycle capture and reset (CR) operation described in regard to FIG. 23.

Figure 34:
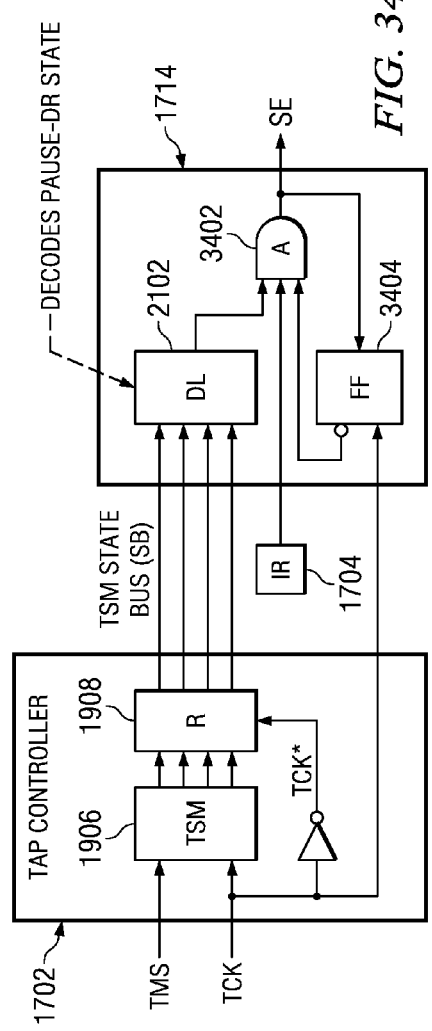
FIG. 34 illustrates alternate additional TAP circuitry for providing a PAT scan enable (SE) signal according to the disclosure.

FIG. 34 illustrates the alternate SE control circuit for controlling the SE output from TAP 1604 to PAT 1204 of FIG. 16. As seen, the alternate SE control circuit is similar to the SE control circuit of FIG. 21 in that it has decode logic 2102 for detecting when the TAP controller 1702 is in the Pause-DR state, a PAT test instruction input signal from IR 1704, and the TCK signal. The alternate SE control circuit differs from the SE control circuit of FIG. 21 in that it includes a three input And gate 3402 and a FF 3404. And gate 3402 inputs the output of the decode logic 2102, the PAT test instruction signal, and the inverted data output of FF 3404. FF 3404 inputs the SE output from And gate 3402 on its data input and the TCK signal on its clock input. The inverted data output of FF 3404 is input to And gate 3402.

If the PAT test instruction signal is not set or the TAP controller is not in the Pause-DR state, the inverted output of FF 3404 will be set high by the low SE output form And gate 3402. When the PAT test instruction signal is set and the TAP controller 1702 enters the Pause-DR state 3206 a first time, the alternate SE control circuit sets the SE output high, as did the SE control circuit of FIG. 21. As seen in FIG. 33, when SE is high and an SC clock occurs the PAT's PCI input and PCO output operation occurs.

If the TAP controller 1702 transitions out of Pause-DR state 3206 to the Shift-DR state 3204 via the Exit2-DR state, the SE signal will go low and clock outputs on SC will be disabled. However if the TAP controller remains in the Pause-DR state a second time, i.e. enters the second Pause-DR state 3208 of FIG. 33, the SE output from And gate 3402 will go low and another SC clock will occur. As seen in FIG. 33, when SE is low and a clock occurs on SC the capture and reset (CR) operation of the PAT scan cycle occurs. The SE output of And gate 3402 will go low during the second Pause-DR state 3208 since the inverted output of FF 3404 will go low as the logic high SE signal from the first Pause-DR state 3206 is clocked into FF 3404 by TCK. Thus by feeding back the SE output of And gate 3402 to an input of And gate 3402, via FF 3404, the second Pause-DR state 3208 can be used to perform the capture and reset (CR) operation of PAT scan cycles.

As will be described below in regard to FIGS. 35-40, using the second Pause-DR state 3208 of FIGS. 32 and 33 to provide the CR operation of a scan cycle instead of using the Capture-DR state to provide the CR operation of the scan cycle is very beneficial when the PAT is being tested in a daisy-chain arrangement 2408.

Figure 35:
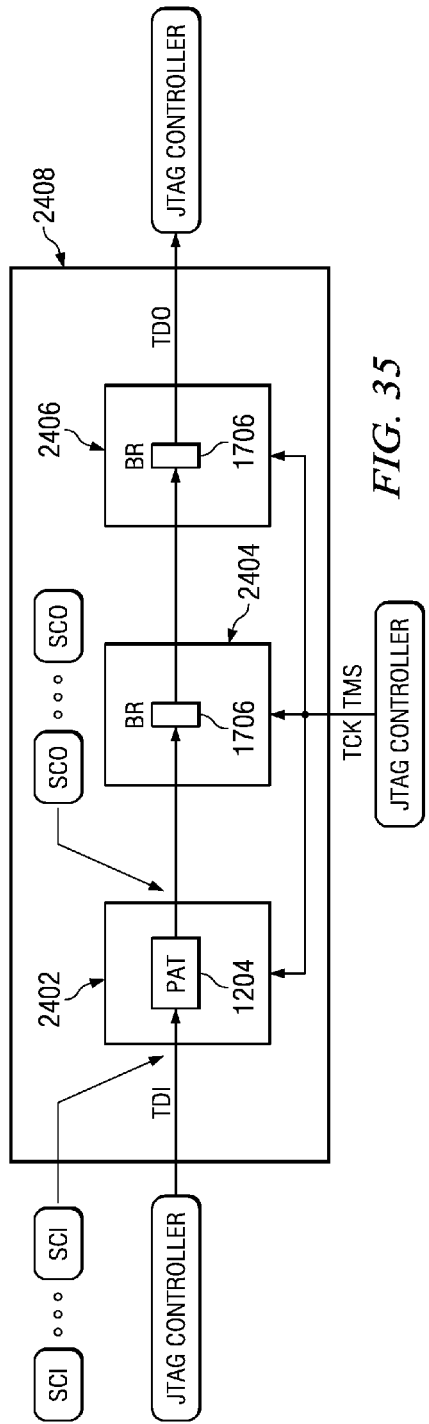
FIG. 35 illustrates a JTAG controller accessing the PAT of a first device in a daisy-chain arrangement of devices using the alternate SE circuitry of FIG. 34 according to the disclosure.

FIG. 35 illustrates a daisy-chain arrangement 2408 where PAT 1204 of the first device 2402 is selected for testing between the device's TDI and TDO terminals and BRs 1706 of trailing devices 2404-2406 are selected between the device's TDI and TDO terminals. The only difference between the arrangements 2408 of FIG. 35 and FIG. 26 is that the TAP 1604 of device 2402 of FIG. 35 includes the alternate SE control circuit of FIG. 34 which enables it to operate, in the second Pause-DR state 3208, to provide the CR operation of the PAT scan cycle timing described earlier in regard to FIGS. 32 and 33.

Figure 36:
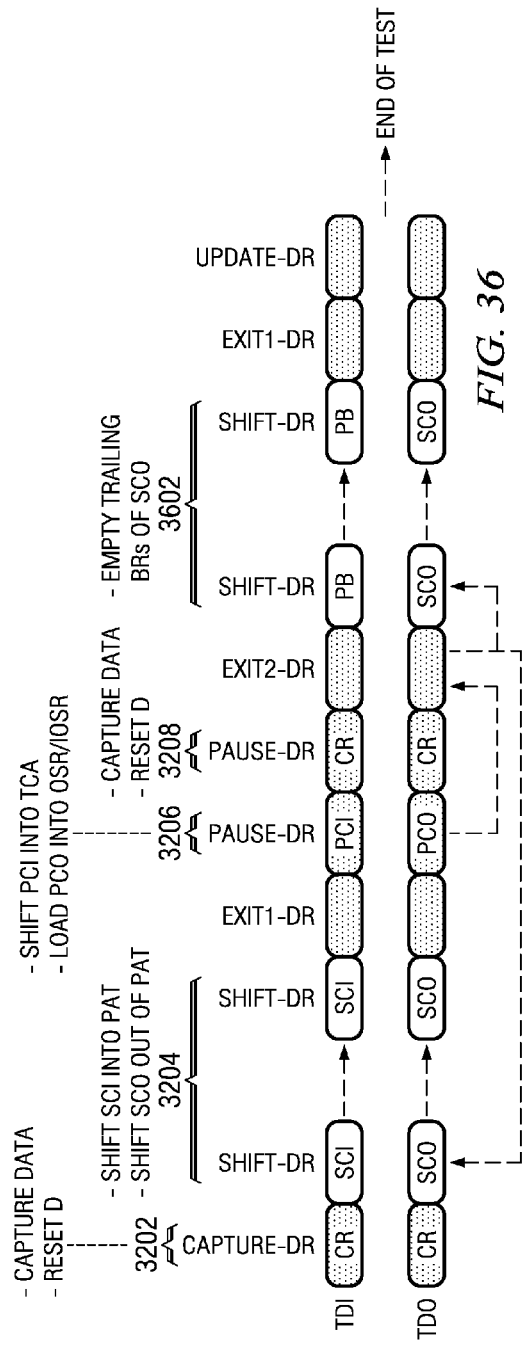
FIG. 36 illustrates the TAP controller state transitions during JTAG controller access of the PAT of FIG. 35 according to the disclosure.

FIG. 36 illustrates the modified TAP 1604 state transitions to test the device 2402 PAT 1204 in the arrangement of FIG. 35. As seen the TAP state transitions 3202-3208 are identical to those described in FIGS. 32 and 33. The process of performing the capture and reset (CR) operation of the PAT scan cycle during the second Pause-DR state 3208 and performing the shift operation of the PAT scan cycle by repeatedly transitioning between the first Pause-DR state 3206 and the Shift-DR state 3204 continues until all scan cycle test patterns have been applied to the PAT's TCA. The only difference between the TAP state transitions of FIG. 36 and FIG. 32 is that the TAP state transitions of FIG. 36 perform a last shift operation during Shift-DR state 3602 to shift out the SCO data from the trailing devices 2404-2406 BRs to the TDO input of the JTAG controller 1606.

It is important to note that since the second Pause-DR state 3208 is used to perform the PAT scan cycle CR operation instead of using the Capture-DR as described in FIG. 27, the BRs of the trailing devices 2404-2406 can be used as pipeline bits between the TDO output of device 2402 and the TDO input of the JTAG controller 1606. As mentioned in regard to FIG. 27, the BRs of trailing devices 2404-2406 cannot be used as pipeline bits since they are loaded with logic zeros during the Capture-DR state.

Advantageously since the BRs of the trailing devices of FIG. 36 can be used as pipeline bits, the PAT scan cycles of FIG. 36 do not include any additional shift cycles, which eliminates the increased PAT test time of the approach described in FIGS. 26 and 27. Also, a single PAT test pattern set can be used to test a PAT 1204 in a leading device in a daisy-chain arrangement regardless of the number of trailing devices in the arrangement, which eliminates the need for multiple PAT test pattern sets mentioned in regard to FIG. 27.

FIG. 37 illustrates a daisy-chain arrangement 2408 where PAT 1204 of an intermediate device 2404 is selected for testing between the device's TDI and TDO terminals and BRs 1706 of leading 2402 and trailing 2406 devices are selected between the device's TDI and TDO terminals. The only difference between the arrangements 2408 of FIG. 37 and FIG. 28 is that the TAP 1604 of device 2404 of FIG. 37 includes the alternate SE control circuit of FIG. 34 which enables it to operate, in the second Pause-DR state 3208, to provide the CR operation of the PAT scan cycle timing described earlier in regard to FIGS. 32 and 33.

FIG. 38 illustrates the modified TAP 1604 state transitions to test the device 2404 PAT 1204 in the arrangement of FIG. 37. As seen the TAP state transitions 3204-3208 and 3602 are identical to those described in FIGS. 35 and 36. The only difference between the TAP state transitions of FIG. 38 and FIG. 36 is that the TAP state transitions of FIG. 38 perform a first shift operation, after the Capture-DR state 3202, in Shift-DR state 3802. This first shift operation is used to fill the BRs of leading devices 2402 with SCI data from the TDI output of the JTAG controller 1606 prior to starting the PAT test. Following the first shift operation the TAP transitions from Shift-DR state 3802 to the second Pause-DR state 3208 via the Exit1-DR and first Pause-DR state 3206 to perform the CR operation of the first PAT scan cycle. The process of performing the capture and reset (CR) operation of the PAT scan cycle during the second Pause-DR state 3208 and performing the shift operation of the PAT scan cycle by repeatedly transitioning between the first Pause-DR state 3206 and the Shift-DR state 3204 continues until all scan cycle test patterns have been applied to the PAT's TCA. As described in FIG. 36, a last shift operation is performed in Shift-DR state 3602 to shift out the SCO data from the BRs of trailing devices 2406 to the TDO input of the JTAG controller 1606.

It is important to note that since the second Pause-DR state 3208 is used to perform the PAT scan cycle CR operation instead of using the Capture-DR state as described in FIG. 29, the BRs of the leading 2402 and trailing 2406 devices can be used as pipeline bits between the TDI output of the JTAG controller and the TDI input of the device 2404 and between the TDO output of device 2404 and the TDO input of the JTAG controller 1606. As mentioned in regard to FIG. 29, the BRs of leading and trailing devices 2404-2406 cannot be used as pipeline bits since they are loaded with logic zeros during the Capture-DR state.

Advantageously since the BRs of the leading and trailing devices of FIG. 38 can be used as pipeline bits, the PAT scan cycles of FIG. 38 do not include any additional shift cycles, which eliminates the increased PAT test time of the approach described in FIGS. 28 and 29. Also, a single PAT test pattern set can be used to test a PAT 1204 in an intermediate device in a daisy-chain arrangement regardless of the number of leading and trailing devices in the arrangement, which eliminates the need for multiple PAT test pattern sets mentioned in regard to FIG. 29.

Further since the PAT scan cycles of FIG. 38 begin by performing the CR operation in the second Pause-DR state 3208, the PATs decompressor 104 is initialized correctly at beginning of the PAT test as it would be for the manufacturing test arrangement of FIG. 16. As mentioned in regard to FIG. 28-31 the PAT decompressor 104 advances when PCI data from ISR 606 or IOSR 904 is input to the decompressor during the Pause-DR state. Since the PCI data will contain the logic zero bypass bits (BB) from leading devices the advancement of the decompressor will be different than expected, which causes the decompressor to not be in the expected starting state. Since the first shift operation of FIG. 38 pre-fills the leading BRs with the starting SCI data, the device PAT will receive the expected PCI data and start the decompressor in the expected starting state.

FIG. 39 illustrates a daisy-chain arrangement 2408 where PAT 1204 of the last device 2404 is selected for testing between the device's TDI and TDO terminals and BRs 1706 of leading devices 2402-2404 are selected between the device's TDI and TDO terminals. The only difference between the arrangements 2408 of FIG. 39 and FIG. 30 is that the TAP 1604 of device 2406 of FIG. 39 includes the alternate SE control circuit of FIG. 34 which enables it to operate, in the second Pause-DR state 3208, to provide the CR operation of the PAT scan cycle timing described earlier in regard to FIGS. 32 and 33.

FIG. 40 illustrates the modified TAP 1604 state transitions to test the device 2406 PAT 1204 in the arrangement of FIG. 39. As seen the TAP state transitions 3202, 3802, 3204-3208 and 3602 are identical to those described in FIG. 38. The only difference between the TAP state transitions of FIG. 40 and FIG. 38 is that the TAP state transitions of FIG. 40 do not need to perform the last shift operation of FIG. 38 since there are no trailing device BRs in the arrangement 2408 of FIG. 40.

It is important to note that since the second Pause-DR state 3208 is used to perform the PAT scan cycle CR operation instead of using the Capture-DR state as described in FIG. 31, the BRs of the leading devices 2402-2404 can be used as pipeline bits between the TDI output of the JTAG controller 1606 and the TDI input of the device 2404. As mentioned in regard to FIG. 31, the BRs of leading devices 2402-2404 cannot be used as pipeline bits since they are loaded with logic zeros during the Capture-DR state.

Advantageously since the BRs of the leading devices of FIG. 40 can be used as pipeline bits, the PAT scan cycles of FIG. 40 do not include any additional shift cycles, which eliminates the increased PAT test time of the approach described in FIGS. 28 and 29. Also, a single PAT test pattern set can be used to test a PAT 1204 in a last device in a daisy-chain arrangement regardless of the number of leading devices in the arrangement, which eliminates the need for multiple PAT test pattern sets mentioned in regard to FIG. 29.

Further since the PAT scan cycles of FIG. 40 begin by performing the CR operation in the second Pause-DR state 3208, the PATs decompressor 104 is initialized correctly at beginning of the PAT test as it would be for the manufacturing test arrangement of FIG. 16. As mentioned in regard to FIG. 28-31 the PAT decompressor 104 advances when PCI data from ISR 606 or IOSR 904 is input to the decompressor during the Pause-DR state. Since the PCI data will contain the logic zero bypass bits (BB) from leading devices the advancement of the decompressor will be different than expected, which causes the decompressor to not be in the expected starting state. Since the first shift operation of FIG. 40 pre-fills the leading BRs with the starting SCI data, the device PAT will receive the expected PCI data and start the decompressor in the expected starting state.

Figure 41:
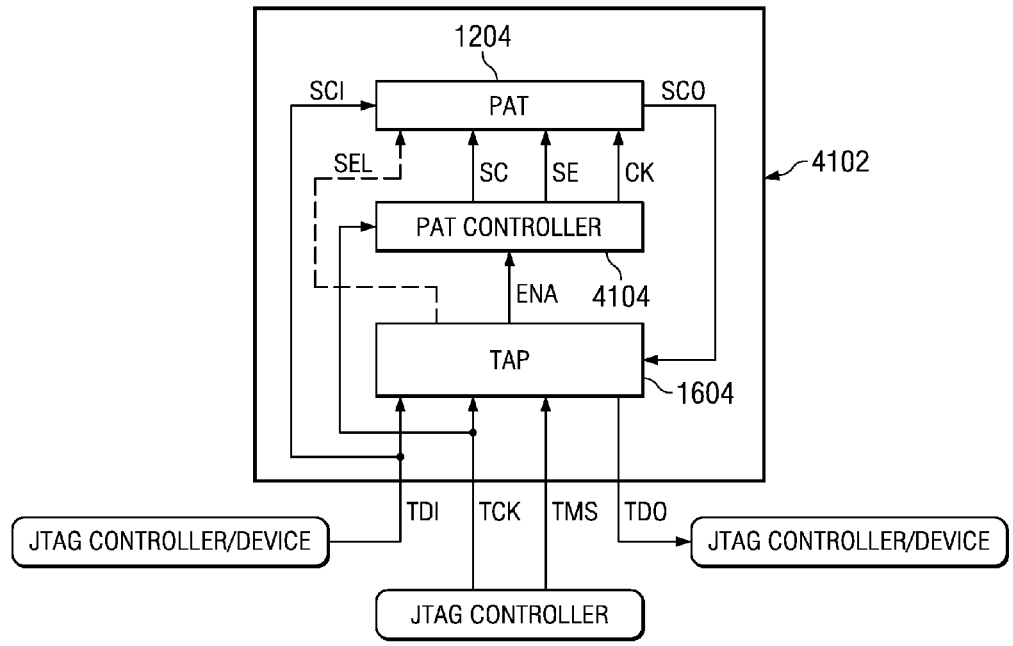
FIG. 41 illustrates a PAT controller located between a device TAP and a programmable access test compression architecture according to the disclosure.

FIG. 41 illustrates another embodiment of the disclosure whereby a device 4102 comprises a PAT 1204, a TAP 1604 and a PAT controller 4104. The PAT controller 4104, once enabled, operates to automatically control the PAT test operation. The device has a TDI input, a TCK, input, a TMS input, and a TDO output. The TDI input and/or TDO output may be connected directly to a JTAG controller as shown in FIG. 16 or to leading and trailing devices as shown in daisy-chain arrangements 2408 The TCK and TMS inputs are connected to a JTAG controller 1604. As seen the PAT controller inputs an enable (ENA) signal from the TAP, and the TCK signal. The PAT controller outputs SC, SE, and CK signals to PAT 1204. The SEL input to the PAT may be either hardwired to the serial test mode or it may receive a SEL output from the TAP's IR 1704, as shown in dotted line. When enabled by the ENA signal, the PAT controller regulates the operation of the SC, SE, and CK signals to operate the PAT in the serial test mode as previously described.

Figure 42:
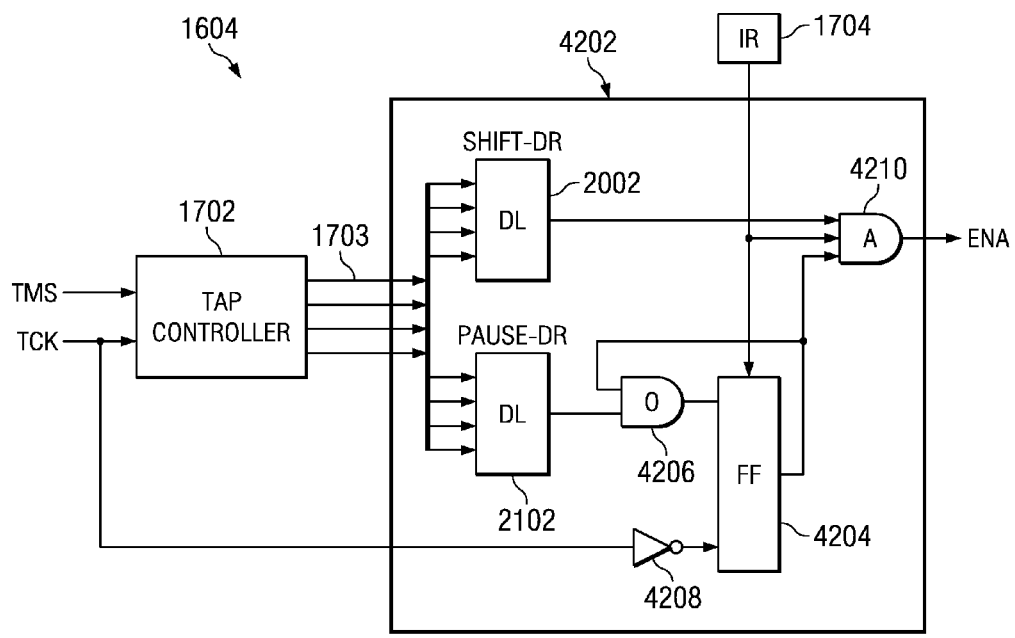
FIG. 42 illustrates circuitry added to the device TAP to enable the PAT controller of FIG. 41 according to the disclosure.

FIG. 42 illustrates how TAP 1604 is modified to include ENA signal producing circuitry 4202. The ENA producing circuitry 4202 includes Shift-DR state decode logic (DL) circuit 2002, Pause-DR state decode logic circuit 2102, a FF 4204, OR gate 4206, and And gate 4210. Decode logic circuits 2002 and 2102 input the state bus 1703 from TAP controller 1702. Decode logic circuit 2002 outputs an enable signal to And gate 4210 when the TAP controller 1702 is in the Shift-DR state. Decode logic circuit 2102 outputs an enable signal to the data input of FF 4204 via Or gate 4206. FF 4204 outputs data to And gate 4210 and to Or gate 4206. FF 4204 has a clock input coupled to the signal via inverter 4208 and a reset input coupled to an instruction output signal from IR 1704. The instruction signal from IR 1704 is also input to And gate 4210. And gate 4210 outputs the ENA signal to the PAT controller 4104.

When a PAT Controller instruction is loaded into IR 1704, the instruction signal is set high to enable And gate 4210 and remove the reset condition to FF 4204. With the instruction signal set high, And gate 4210 will output a high on the ENA signal when the Shift-DR enable signal from decode logic 2002 is high and the data output from FF 4204 is high. As can be seen, the ENA signal from And gate 4210 will not be set high until the TAP controller 1702 has transitioned through the Pause-DR state, which latches the output of FF 4204 high via OR gate 4206, and enters the Shift-DR state. Waiting to set the ENA signal high until the TAP controller 1702 transitions through the Pause-DR state is beneficial in daisy-chain arrangements 2408 since it allows delaying the start of the PAT controller until SCI data has been shifted into the BRs of leading devices.

Figure 43:
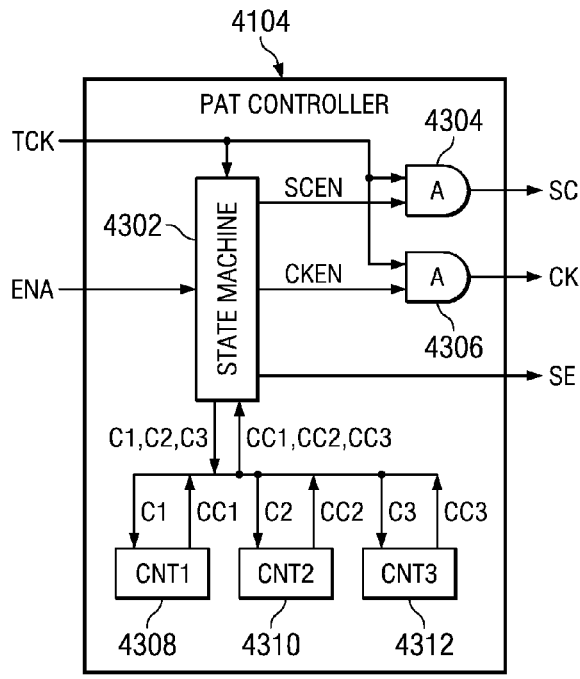
FIG. 43 illustrates the PAT controller of FIG. 41 in more detail.

FIG. 43 illustrates an example implementation of PAT controller 4104 which comprises a state machine 4302, And gates 4304 and 4306, a first counter 4308 (CNT1), a second counter 4310 (CNT2), and a third counter 4312 (CNT3). The state machine 4302 inputs the ENA signal, the TCK signal, a count complete 1 (CC1) signal from the first counter 4308, a count complete 2 (CC2) signal from the second counter 4310, and a count complete 3 (CC3) signal from the third counter 4312. The state machine 4302 outputs an SC enable (SCEN) signal to And gate 4304, a CK enable (CKEN) signal to And gate 4306, the SE signal, control 1 (C1) signals to the first counter 4308, control 2 (C2) signals to the second counter 4310, and control 3 (C3) signals to the third counter 4312. The C1, C2, and C3 signals control the operation of the first, second, and third counters. And gate 4304 inputs the TCK signal and outputs the SC signal. And gate 4306 inputs the TCK signal and outputs the CK signal.

Figure 44:
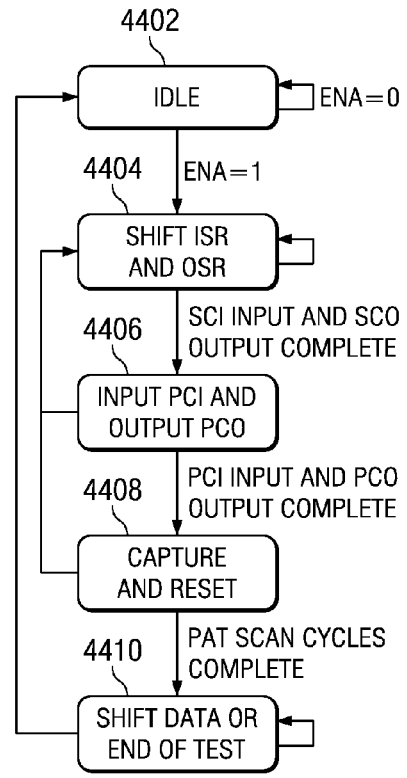
FIG. 44 illustrates the operational state diagram of the PAT controller of FIG. 43.

FIG. 44 illustrate the operational states of the PAT controller. When the ENA signal is low, the PAT controller will be in Idle state 4402. When the ENA signal goes high, the PAT controller transitions to the Shift ISR and OSR state 4404 to shift SCI data into the ISR and SCO data from OSR in response a low on SE and clocks on CK. Upon entering state 4404, the device's TAP will remain in the Shift-DR state until the PAT test is complete. The PAT controller 4104 remains in state 4404 until the SCI and SCO shift operation is complete which is indicated by CC1 signal from the first counter. The first counter contains the shift count length of the ISR and OSR. When that count length is reached the CC1 signal is set which causes the PAT controller to transition to the Input PCI and Output PCO state 4406. In state 4406, the PAT controller sets the SE signal high and outputs a clock on SC which inputs the PCI data from the ISR to the TCA and outputs PCO data from the TCA to the OSR. If the TCA PCI input and PCO output operation is not complete the CC2 signal from the second counter will not be set and the PAT controller 4104 will transition from state 4406 to state 4404 to perform another SCI input and SCO output shift operation. The second counter contains the number of PCI input and PCO output operations required to fill and empty the TCA scan paths. States 4404 and 4406 perform the shift operation of the PAT scan cycle.

When the TCA PCI input and PCO output operation is complete the CC2 signal from the second counter is set which causes the PAT controller 4104 to transition from state 4406 to the Capture and Reset state 4408 to perform a CR operation of the PAT scan cycle by setting SE low and providing a clock on SC. If the required number of PAT scan cycles is not complete, the CC3 signal from the third counter will not be set and the PAT controller 4104 will transition from state 4408 to state 4404 to perform additional scan cycle shift operations. The third counter contains the number of required PAT scan cycles.

When the required number of PAT scan cycles have been performed, the PAT controller 4104 will transition from state 4408 to the Shift Data or End Of Test state 4410. If a single device is being tested by the JTAG controller as shown in FIG. 16, state 4410 is an End Of Test state and the JTAG controller can transition the device's TAP out of the Shift-DR state which causes the PAT controller 4104 to transition to Idle state 4402. However, if the device is being tested in a daisy-chain arrangement 2408 with trailing devices, state 4410 is a Shift Data state and the JTAG controller remains in state 4410 for as long as necessary to shift SCO data from the BRs of trailing devices. Once the trailing BRs have been emptied of SCO data the JTAG controller transitions the device's TAP from the Shift-DR state which causes the PAT Controller 4104 to transition from state 4410 to the Idle state 4402.

Figure 45:
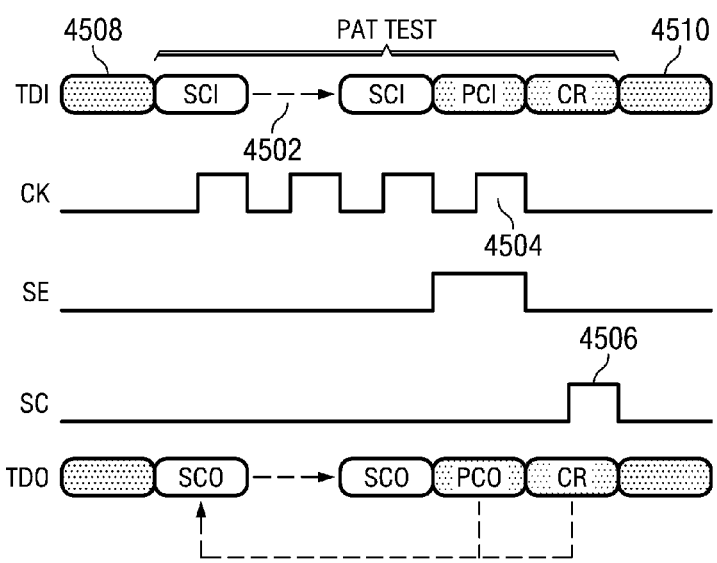
FIG. 45 illustrates the operational timing diagram of the PAT controller of FIG. 43.

FIG. 45 illustrates the operational timing diagram of the PAT controller's CK, SE, and SC output signals. As seen the PAT test includes the input of SCI data and output SCO data 4502 during state 4404, the input of PCI data and the output of PCO data 4504 in state 4406, and the CR operation 4506 in state 4408. These PAT test operations are repeated per the state diagram of FIG. 44 until the PAT test is complete. During the PAT test operations, the device TAP remains in the Shift-DR state. In daisy-chain arrangements, leading operations 4508 may be executed to fill leading device BRs with SCI data and trailing operations 4510 may be executed to empty trailing device BRs of SCO data.

The advantage of using the PAT controller 4104 to control PAT testing as described in above FIGS. 41-45 is that it eliminates the need of having to transition the device TAP through different states. The PAT test occurs by simply loading the PAT Controller test instruction, then transitioning the device TAP to the Shift-DR state to stream SCI data in and SCO data out of the device.

Although the disclosure has been described in detail, it should be understood that various changes, substitutions and alterations may be made without departing from the spirit and scope of the disclosure as defined by the appended claims.

What is claimed is:

1. A programmable access test compression architecture comprising:
    (a) functional circuitry having test stimulus inputs and test response outputs;
    (b) scan path circuits, each scan path circuit having a scan input, a scan output, a clock input, a scan enable input, stimulus outputs coupled to the stimulus inputs of the functional logic, and response inputs coupled to the response outputs of the functional logic;
    (c) decompressor circuitry having parallel compressed data inputs and having outputs connected to the scan inputs of the scan path circuits;
    (d) compactor circuitry having inputs connected to the scan outputs of the scan path circuits and having parallel compressed data outputs;
    (e) a scan clock input coupled to the scan path circuits, the decompressor circuitry, and the compressor circuitry;
    (f) a scan enable input coupled to the scan path circuits, the decompressor circuitry, and the compressor circuitry; and
    (g) an input/output shift register having a serial compressed data input, a serial compressed data output, parallel inputs coupled to the parallel compressed data outputs, parallel outputs coupled to the parallel compressed data inputs of the decompressor circuitry, and a shift clock input.

2. The programmable access test compression architecture of claim 1 in which the shift clock input is connected to the scan enable input.

* * * * *

UNITED STATES PATENT AND TRADEMARK OFFICE
CERTIFICATE OF CORRECTION

PATENT NO. : 9,599,669 B2
APPLICATION NO. : 15/151035
DATED : March 21, 2017
INVENTOR(S) : Lee D. Whetsel It is certified that error appears in the above-identified patent and that said Letters Patent is hereby corrected as shown below:

In the Claims

On Column 22, Line 32, of Claim 1: Replace the word "compressor" with -- compactor --

On Column 22, Line 34, of Claim 1: Replace the word "compressor" with -- compactor --

Signed and Sealed this
Twenty-eighth Day of March, 2023

Katherine Kelly Vidal
*Director of the United States Patent and Trademark Office*